(12) United States Patent
Chae et al.

(10) Patent No.: US 9,012,974 B2
(45) Date of Patent: Apr. 21, 2015

(54) VERTICAL MEMORY DEVICES AND METHODS OF MANUFACTURING THE SAME

(75) Inventors: Soo-Doo Chae, Yongin-si (KR); Ki-Hyun Hwang, Seongnam-si (KR); Han-Mei Choi, Seoul (KR); Dong-Chul Yoo, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 703 days.

(21) Appl. No.: 13/246,152

(22) Filed: Sep. 27, 2011

(65) Prior Publication Data
US 2012/0098139 A1    Apr. 26, 2012

(30) Foreign Application Priority Data
Oct. 21, 2010   (KR) .................. 10-2010-0102718

(51) Int. Cl.
| | | |
|---|---|---|
| H01L 29/792 | (2006.01) | |
| H01L 21/336 | (2006.01) | |
| H01L 27/115 | (2006.01) | |

(52) U.S. Cl.
CPC ...... H01L 27/11582 (2013.01); H01L 29/7926 (2013.01)

(58) Field of Classification Search
USPC .......... 257/319, 324, 326, E29.309, E21.212, 257/E21.41, E29.262; 438/259, 268, 275, 438/279, 282, 283, 287, 288
See application file for complete search history.

(56) References Cited

U.S. PATENT DOCUMENTS

| | | |
|---|---|---|
| 2007/0158736 A1* | 7/2007 | Arai et al. ............... 257/315 |
| 2009/0173981 A1 | 7/2009 | Nitta |
| 2010/0072538 A1 | 3/2010 | Kito et al. |

FOREIGN PATENT DOCUMENTS

KR    20100036520 A    4/2010

* cited by examiner

*Primary Examiner* — Jose R Diaz
(74) *Attorney, Agent, or Firm* — Harness, Dickey & Pierce, P.L.C.

(57) ABSTRACT

A vertical memory device includes a channel, a ground selection line (GSL), word lines, a string selection line (SSL), and a contact. The channel includes a vertical portion and a horizontal portion. The vertical portion extends in a first direction substantially perpendicular to a top surface of a substrate, and the horizontal portion is connected to the vertical portion and parallel to the top surface of the substrate. The GSL, the word lines and the SSL are formed on a sidewall of the vertical portion of the channel sequentially in the first direction, and are spaced apart from each other. The contact is on the substrate and electrically connected to the horizontal portion of the channel.

14 Claims, 36 Drawing Sheets

FIG. 3
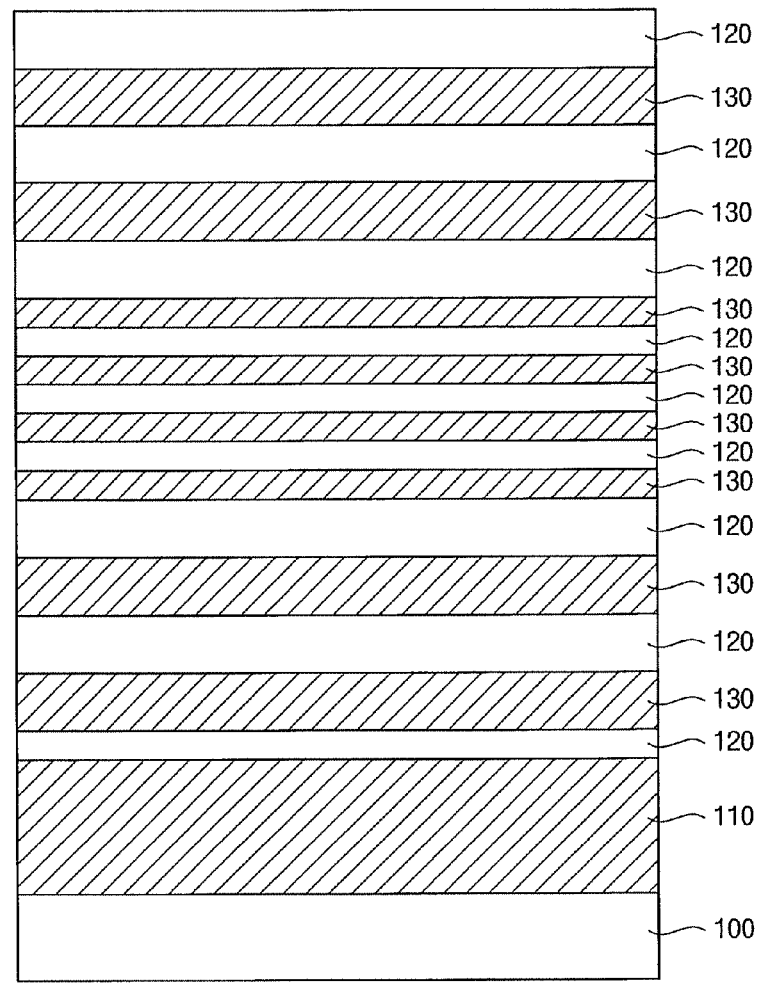
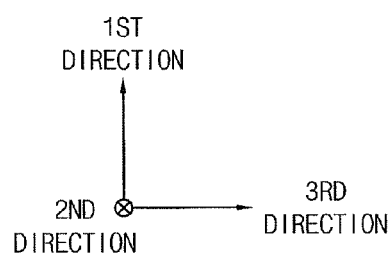

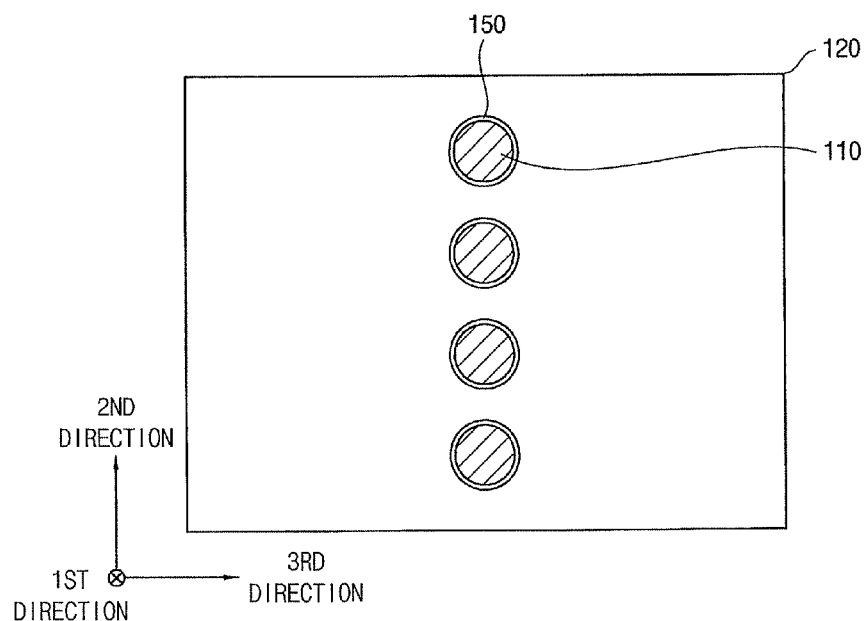
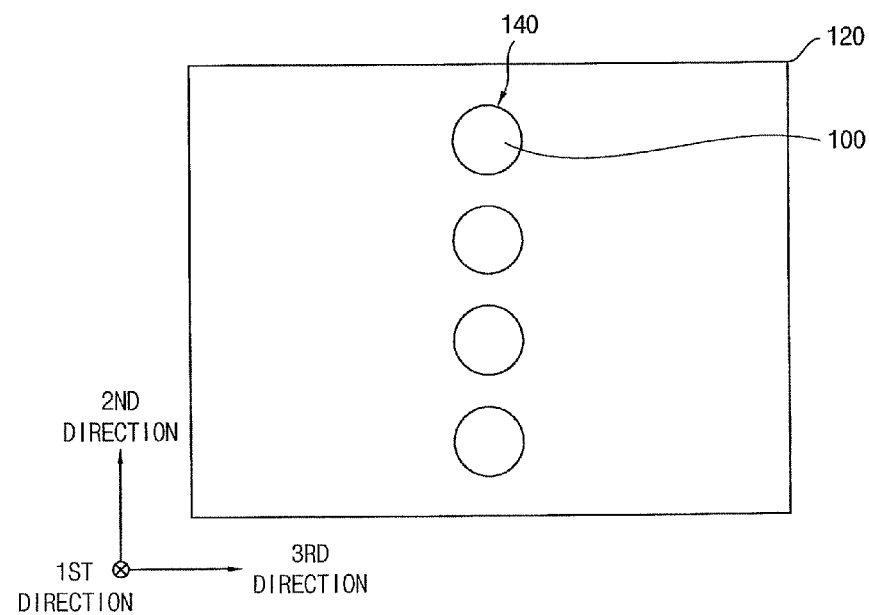

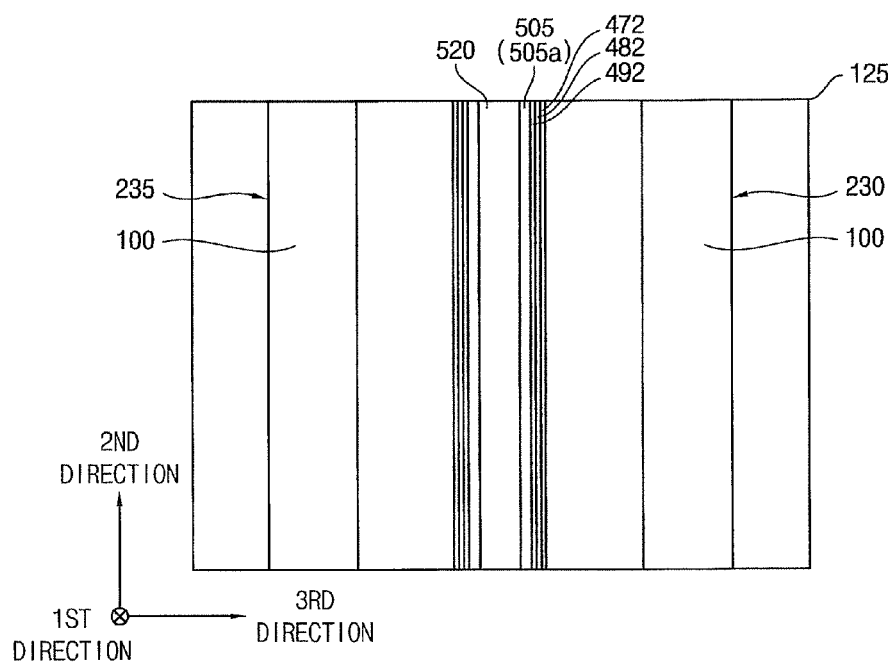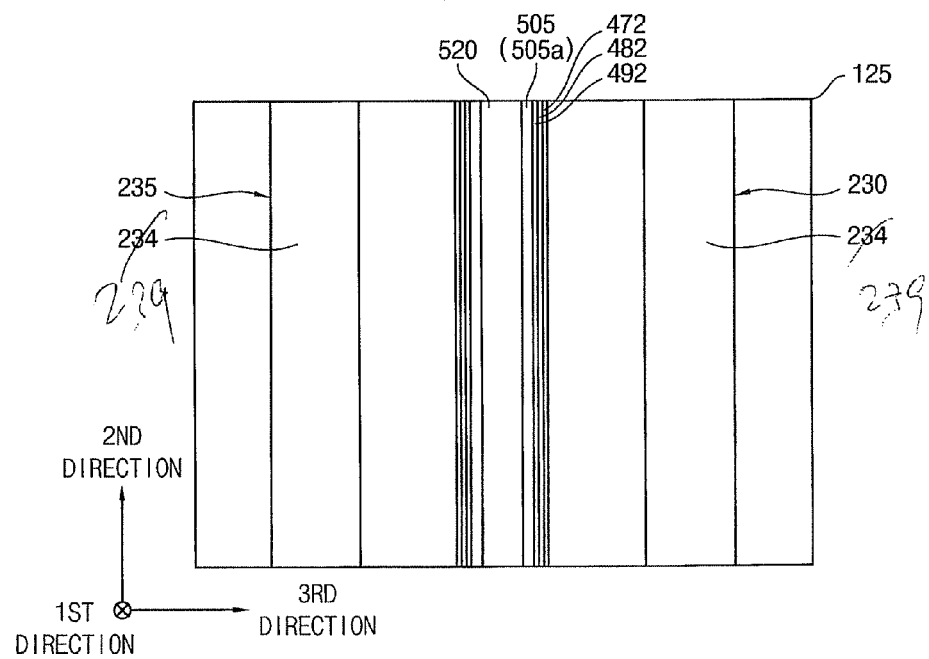

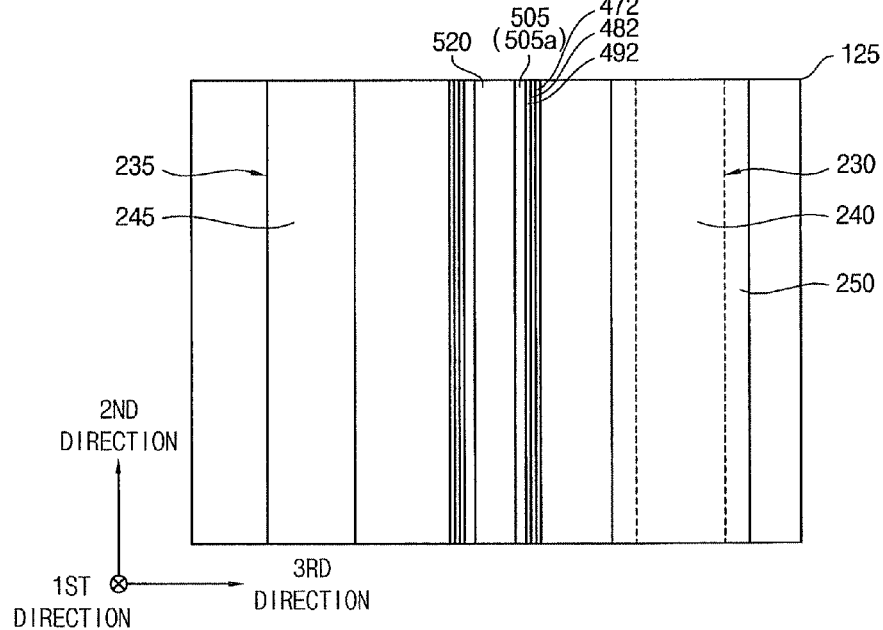
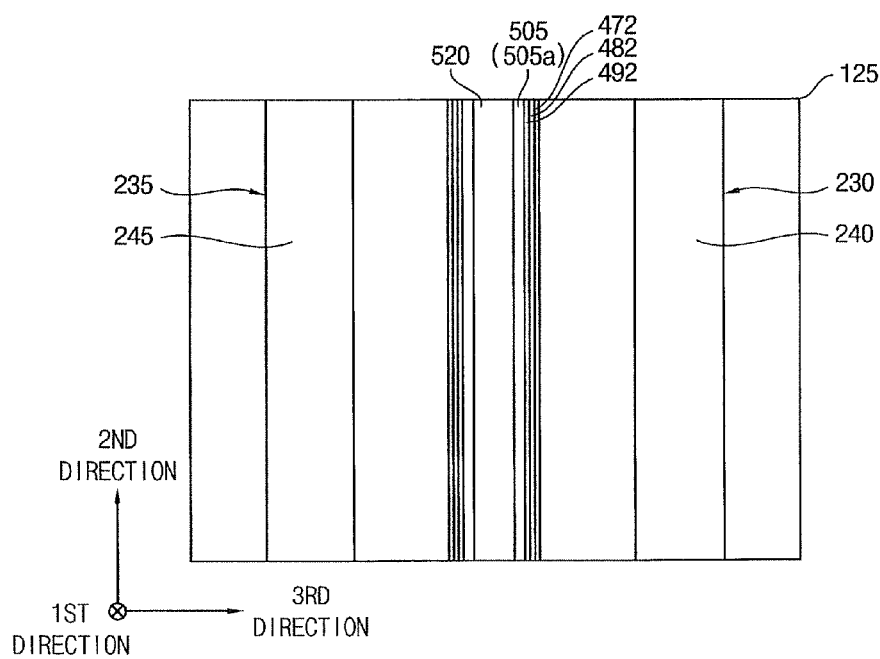

VERTICAL MEMORY DEVICES AND METHODS OF MANUFACTURING THE SAME

CROSS-REFERENCE TO RELATED APPLICATION

This application claims priority under 35 USC §119 to Korean Patent Application No. 10-2010-0102718 filed on Oct. 21, 2010, in the Korean Intellectual Property Office (KIPO), the entire contents of which is incorporated herein by reference

BACKGROUND

1. Field

Example embodiments relate to vertical memory devices and methods of manufacturing the same.

2. Description of the Related Art

Vertical memory devices may be memory devices with increased integration density as compared to planar devices. In a method of manufacturing a vertical memory device, after alternately depositing a plurality of memory cells and insulation layers, the memory cells and the insulation layers are etched to form an opening. Polysilicon is deposited in the opening to form a channel. The channel electrically connects to a common source line and/or a bulk line well.

SUMMARY

Example embodiments may provide vertical memory devices with good and/or improved characteristics. Example embodiments may provide methods of manufacturing vertical memory devices with good and/or improved characteristics.

According to example embodiments, there is provided a vertical memory device. The device includes a channel, a ground selection line (GSL), word lines, a string selection line (SSL), and a contact. The channel includes a vertical portion and a horizontal portion. The vertical portion extends in a first direction substantially perpendicular to a top surface of a substrate, and the horizontal portion is connected to the vertical portion and parallel to the top surface of the substrate. The GSL, the word lines and the SSL are on a sidewall of the vertical portion of the channel sequentially in the first direction, and are spaced apart from each other. The contact is on the substrate and electrically connected to the horizontal portion of the channel.

According to example embodiments, a plurality of vertical portions of the channel having an island shape from each other may be in a second direction substantially parallel to the top surface of the substrate to define a vertical portion column. The horizontal portion of the channel may be on the substrate to be connected to the vertical portion column. According to example embodiments, two contacts may be before and after the vertical portion column, respectively, in a third direction substantially perpendicular to the second direction. Each contact may extend in the second direction.

According to example embodiments, the vertical memory device may further include a common source line (CSL) and a bulk line electrically connected to the contacts, respectively. Each of the CSL and the bulk line may extend in the second direction. According to example embodiments, the vertical memory device may further include a bit line electrically connected to the vertical portion. The bit line may extend in a third direction substantially perpendicular to the second direction.

According to example embodiments, the channel may have a hollow cylindrical shape. According to example embodiments, the vertical memory device may further include a filling layer pattern filling a space defined by the hollow cylindrical shape. According to example embodiments, the contact may include single crystalline silicon. According to example embodiments, the vertical memory device may further include a tunnel insulation layer pattern, a charge trapping layer pattern and a blocking layer pattern sequentially stacked on and surrounding a surface of the channel. According to example embodiments, the vertical portion of the channel may have a linear shape extending in the first direction.

According to example embodiments, there is provided a method of manufacturing a vertical memory device. In the method, a channel including a vertical portion and a horizontal portion may be formed. The vertical portion extends in a first direction substantially perpendicular to a top surface of a substrate, and the horizontal portion is connected to the vertical portion and parallel to the top surface of the substrate. A contact electrically connected to the horizontal portion of the channel is formed. A GSL, word lines and an SSL are formed on a sidewall of the vertical portion of the channel in the first direction. The GSL, the word lines and the SSL are spaced apart from each other.

According to example embodiments, when the channel is formed, a first sacrificial layer may be formed on the substrate. A plurality of insulation layers and second sacrificial layers are alternately formed on the first sacrificial layer. A first opening is formed through the insulation layers and the second sacrificial layers to expose the first sacrificial layer. The first sacrificial layer is removed to form a gap exposing the substrate. The vertical portion and the horizontal portion are formed in the first opening and the gap, respectively.

According to example embodiments, each of the vertical portion and the horizontal portion may be formed to have a hollow cylindrical shape. A plurality of vertical portions may be formed in a second direction substantially parallel to a top surface of the substrate. According to example embodiments, a filling layer filling spaces defined by the hollow cylindrical shapes of the vertical and horizontal portions may be further formed. According to example embodiments, a plurality of vertical portions of the channel may be formed on a second direction substantially parallel to the top surface of the substrate. Each vertical portion of the channel may have a linear shape extending in the first direction.

According to example embodiments, the channel of the vertical memory device may include a vertical portion and a horizontal portion, and the horizontal portion may make contact with first and second contacts protruding from a substrate. Each of the first and second contacts is connected to the bulk line and the CSL, and thus the channel may be electrically connected to the bulk line and the CSL. The channel and the bulk line or the channel and the CSL may have good electrical connection via the first and second contacts. The bulk line may be formed adjacent to the vertical portion of the channel, and the vertical memory device may have improved data erase characteristics.

According to at least one example embodiment, a vertical memory device includes a semiconductor layer, a channel extending in a first direction and a second direction on the semiconductor layer, the first direction substantially perpendicular to the semiconductor layer and the second direction substantially parallel to the semiconductor layer, a first conductive line on the substrate, the conductive line spaced apart from a side of the channel in the second direction, and a first contact spaced apart from the side of the channel in the second direction, the first contact connected between the first conductive line and the semiconductor layer, and between the first conductive line and a portion of the channel extending in the second direction.

BRIEF DESCRIPTION OF THE DRAWINGS

Example embodiments will be more clearly understood from the following detailed description taken in conjunction with the accompanying drawings.

FIGS. 1 and 2 are a cross-sectional diagram and a plan diagram, respectively, illustrating vertical memory devices in accordance with example embodiments;

FIGS. 3-13 and FIGS. 14-23 are cross-sectional diagrams and plan diagrams, respectively, illustrating methods of manufacturing a vertical memory device of FIGS. 1 and 2 in accordance with example embodiments;

FIGS. 35-46 are plan diagrams illustrating method of manufacturing a vertical memory device of FIG. 34 in accordance with example embodiments;

FIG. 52 is a block diagram illustrating electronic systems according to example embodiments.

Figure 1:
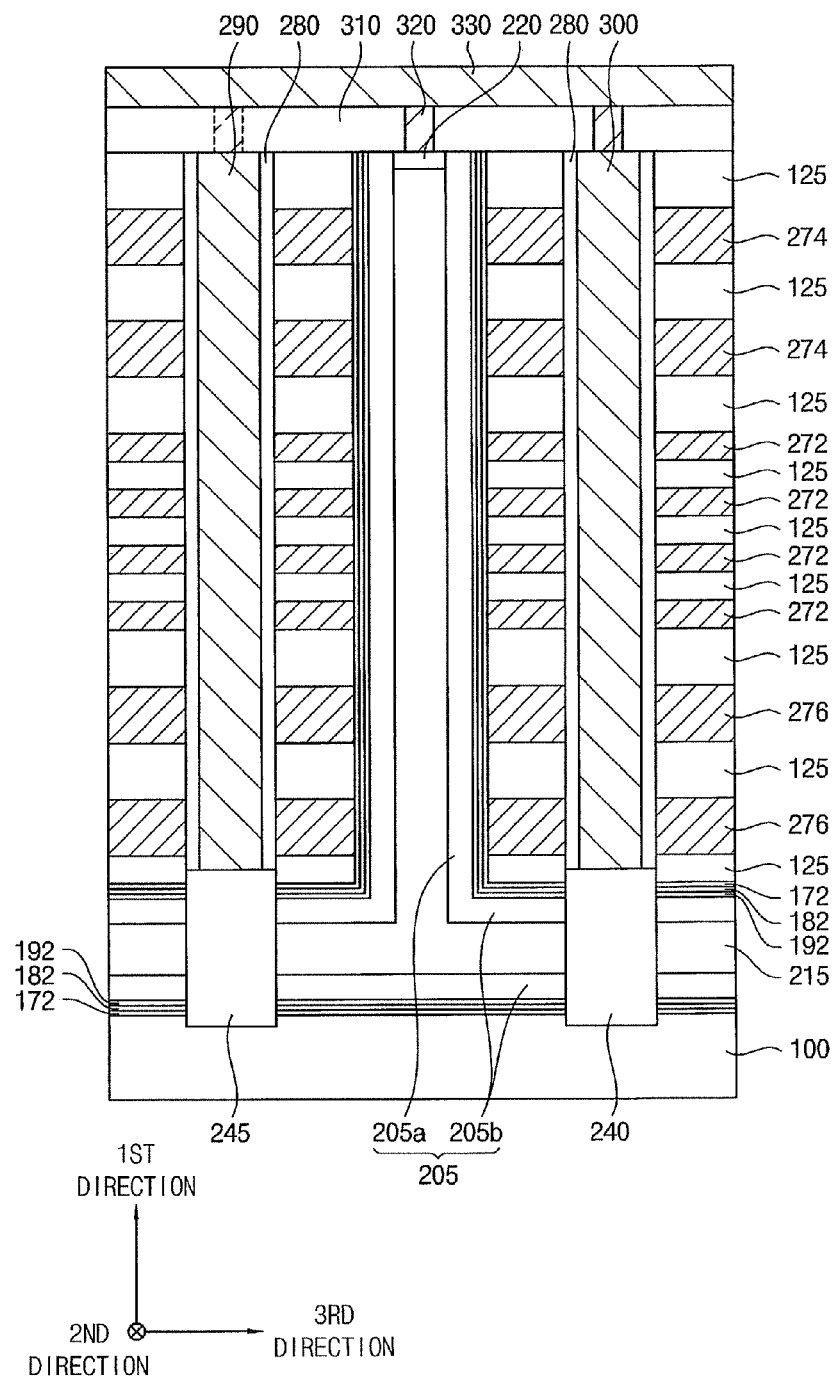
FIGS. 1-52 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully hereinafter with reference to the accompanying drawings, in which some example embodiments are shown. Example embodiments may, however, be embodied in many different forms and should not be construed as limited to the example embodiments set forth herein; rather, these example embodiments are provided so that this description will be thorough and complete, and will fully convey the scope of the present inventive concept to those skilled in the art. In the drawings, the thickness of layers and regions are exaggerated for clarity.

Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region funned by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
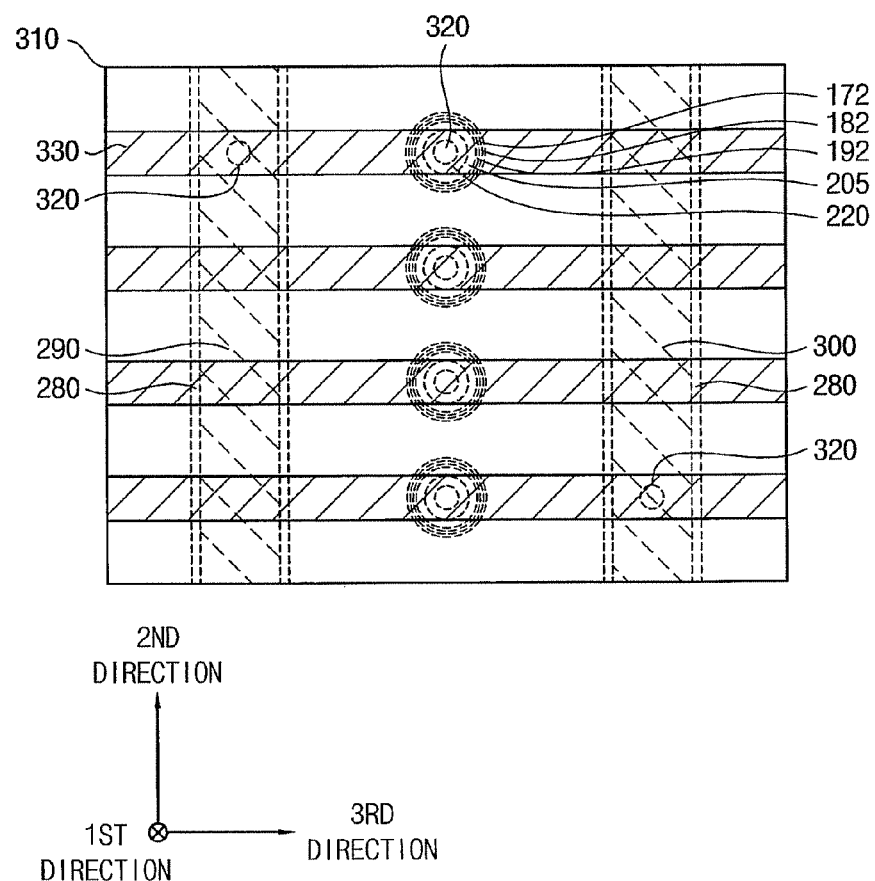

FIGS. 1 and 2 are a cross-sectional diagram and a plan diagram, respectively, illustrating vertical memory devices in accordance with example embodiments. Referring to FIGS. 1 and 2, a vertical memory device may include a first channel 205, a ground selection line (GSL) 276, a word line 272, a string selection line (SSL) 274, first and second contacts 240 and 245, a common source line (CSL) 290 and a bulk line 300. The vertical memory device may include a bit line 330.

The channel 205 may include a first vertical portion 205a and a first horizontal portion 205b connected to the first vertical portion 205a. The first vertical portion 205a may extend along a substrate 100 in a first direction substantially perpendicular to a top surface of the substrate 100, and the first horizontal portion 205b may be parallel to the top surface of the substrate 100. According to example embodiments, the first channel 205 may include a semiconductor, for example, doped polysilicon and/or single crystalline silicon.

According to example embodiments, a plurality of first vertical portions 205a may be in a second direction substantially parallel to the top surface of the substrate 100 to define a first vertical portion column, and a plurality of first vertical portion columns may be formed in a third direction substantially perpendicular to the second direction to define a first vertical portion array. The first horizontal portion 205b of the first channel 205 may be connected to the first vertical portion column or the first vertical portion array.

According to example embodiments, the first vertical portion 205a of the first channel 205 may be of a hollow cylindrical shape, and the first horizontal portion 205b of the first channel 205 may include two parallel plates spaced apart from each other. A first filling layer pattern 215 may be in a space defined by the hollow cylindrical shape of the first vertical portion 205a and in the space defined by the two parallel plates of the first horizontal portion 205b. The first filling layer pattern 215 may include an insulating material, for example, an oxide.

According to example embodiments, the first vertical portion 205a of the first channel 205 may be pillar shaped, and the first horizontal portion 205b of the first channel 205 may include a single plate. The vertical memory device may not include the first filling layer pattern 215.

A pad 220 may be on the first filling layer pattern 215 to fill a remaining portion of the space defined by the hollow cylindrical first vertical portion 205a, and may electrically connect the first channel 205 to a bit line contact 320. According to at least one example embodiment, the pad 220 may include doped polysilicon. The GSL 276, the word line 272 and the SSL 274 may be on an outer sidewall of the first vertical portion 205a of the first channel 205 sequentially in the first direction, and spaced apart from each other.

Each of the GSL 276, the word line 272 and the SSL 274 may be at one level or more than one level (e.g., one or more of each), and a first insulation layer pattern 125 may be interposed therebetween. According to at least one example embodiment, each of the GSL 276 and the SSL 274 may be at two levels, and the word line 272 may be formed at 4 levels between the GSLs 276 and the SSLs 274. According to at least one example embodiment, for example, each of the GSL 276 and the SSL 274 may be at a single level, and the word line 272 may be formed at 2, 8 or 16 levels. According to example embodiments, each of the GSL 276, the word line 272 and the SSL 274 may extend in the second direction, and a plurality of GSLs 276, a plurality of word lines 272, and a plurality of SSLs 274 may be in the third direction. The first insulation layer pattern 125 may include, for example, a silicon oxide (e.g., silicon dioxide ($SiO_2$), silicon oxycarbide (SiOC) and/or silicon oxyfluoride (SiOF)).

A first tunnel insulation layer pattern 192, a first charge trapping layer pattern 182 and a first blocking layer pattern 172 may be sequentially formed between each of the GSL 276, the word line 272 and the SSL 274, and an outer sidewall of the first vertical portion 205a of the first channel 205 in a direction substantially perpendicular to the outer sidewall of the first vertical portion 205a (e.g., in the third direction). The first tunnel insulation layer pattern 192, the first charge trapping layer pattern 182 and the first blocking layer pattern 172 may be between an outer sidewall of the first horizontal portion 205b of the first channel 205 and the first insulation layer pattern 125 and/or the substrate 100.

According to example embodiments, the GSL 276, the word line 272 and the SSL 274 may include, for example, a metal and/or a metal nitride. For example, the GSL 276, the word line 272 and the SSL 274 may include a metal and/or a metal nitride with low electrical resistance (e.g., tungsten, tungsten nitride, titanium, titanium nitride, tantalum, tantalum nitride and/or platinum). According to at least one example embodiment, each of the GSL 276, the word line 272 and the SSL 274 may be a multi-layered structure including a barrier layer (e.g., a metal nitride) and a metal layer (e.g., a metal).

According to example embodiments, the first tunnel insulation layer pattern 192 may include, for example, a silicon oxide, and the first charge trapping layer pattern 182 may include, for example, a nitride (e.g., a silicon nitride) and/or a metal oxide. According to example embodiments, the first blocking layer pattern 172 may include, for example, a silicon oxide and/or a metal oxide (e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide). According to at least one example embodiment, the first blocking layer pattern 172 may be a multi-layered structure including a silicon oxide layer and a metal oxide layer.

Each of the first and second contacts 240 and 245 may extend through the first tunnel insulation layer pattern 192, the first charge trapping layer pattern 182, the first blocking layer pattern 172, the first horizontal portion 205b of the first channel 205 and the first filling layer pattern 215, and may protrude from a top surface of the substrate 100 so as to be connected to the bulk line 300 and the CSL 290, respectively. According to example embodiments, a height of the first and second contacts 240 and 245 may be greater than that of the first horizontal portion 205b of the first channel 205 and less than that of the GSL 276. According to example embodiments, each of the first and second contacts 240 and 245 may extend in the second direction. According to example embodiments, the first contact 240 may include, for example, single crystalline silicon doped with p-type impurities, and the second contact 245 may include, for example, single crystalline silicon doped with n-type impurities.

Each of the bulk line 300 and the CSL 290 may be between structures each of which may include the GSL 276, the word line 272, the SSL 274 and the first insulation layer pattern 125, and may be connected to the first and second contacts 240 and 245, respectively. As each of the first and second contacts 240 and 245 may extend in the second direction, each of the bulk line 300 and the CSL 290 may also extend in the second direction. According to example embodiments, one bulk line 300 and one CSL 290 may be before and after the first vertical portion 205a of the first channel 205, respectively, in the third direction. According to example embodiments, the bulk line 300 and the CSL 290 may include, for example, doped polysilicon, a metal and/or a metal nitride.

A second insulation layer pattern 280 may be between each of the bulk line 300 and the CSL 290 and the structure including the GSL 276, the word line 272, the SSL 274 and the first insulation layer pattern 125. The GSL 276, the word line 272 and the SSL 274 may be insulated from the bulk line 300 and/or the CSL 290. The second insulation layer pattern 280 may include an insulating material, for example, a silicon oxide and/or a silicon nitride. The bit line 330 may be electrically connected to the pad 220 via the bit line contact 320, and may be electrically connected to the first channel 205 via the pad 220. The bit line 330 may include, for example, a metal, a metal nitride and/or doped polysilicon. According to example embodiments, the bit line 330 may extend in the third direction.

The bit line contact 320 may be in a third insulation layer 310, and may contact the pad 220 and the bit line 330. The bit line contact 320 may include, for example, a metal, a metal nitride and/or doped polysilicon. The third insulation layer 310 may be on the first and second insulation layer patterns 125 and 280, the pad 220, the bulk line 300, the CSL 290, the first blocking layer pattern 172, the first charge trapping layer pattern 182 and/or the first tunnel insulation layer pattern 192. According to example embodiments, the third insulation layer 310 may include an insulating material, for example, an oxide.

The first channel 205 of the vertical memory device may include the first vertical portion 205a and the first horizontal portion 205b, and the first horizontal portion 205b may contact the first and second contacts 240 and 245 protruding from the substrate 100. As the first and second contacts 240 and 245 may be connected to the bulk line 300 and the CSL 290, respectively, the first channel 205 may be electrically connected to the bulk line 300 and the CSL 290. An electrical connection between the first channel 205 and the bulk line 300 and/or the first channel 205 and the CSL 290, via the first and second contacts 240 and 245, respectively, may be good and/or improved. As the bulk line 300 may be adjacent to the first vertical portion 205a of the first channel 205, data erase characteristics of the vertical memory device may be improved.

FIGS. 3-13 and FIGS. 14-23 are cross-sectional diagrams and plan diagrams, respectively, illustrating methods of manufacturing a vertical memory device of FIGS. 1 and 2 in accordance with example embodiments. Referring to FIGS. 3 and 14, a first sacrificial layer 110 may be formed on a substrate 100, and a first insulation layer 120 and a second sacrificial layer 130 may be alternately and repeatedly formed on the first sacrificial layer 110. A plurality of second insulation layers 120 and a plurality of second sacrificial layers 130 may be alternately formed on each other at a plurality of levels, respectively.

The substrate 100 may include a semiconductor material, for example, silicon and/or germnanium. The substrate 100 may include a cell region and a peripheral circuit region, and hereinafter only structures formed in the cell region may be illustrated.

According to example embodiments, the first and second sacrificial layers 110 and 130 and the first insulation layer 120 may be formed by, for example, a chemical vapor deposition (CVD) process, a plasma chemical vapor deposition (PECVD) process and/or an atomic layer deposition process (ALD) process. According to example embodiments, the first insulation layer 120 may be formed using a silicon oxide, for example, silicon dioxide ($SiO_2$), silicon oxycarbide (SiOC) and/or silicon oxyfluoride (SiOF). The first and second sacrificial layers 110 and 130 may be formed to include a material with etch selectivity to the first insulation layer 120 (e.g., a silicon nitride and/or silicon boronitirde). According to at least one example embodiment, the first insulation layer 120 may be formed using a silicon nitride, and the first and second sacrificial layers 110 and 130 may be formed using a silicon oxide.

According to example embodiments, the second sacrificial layer 130 at a level at which a GSL 276 (refer to FIG. 12) or an SSL 274 (refer to FIG. 12) may be formed subsequently may have a thickness larger than that of the second sacrificial layer 130 at a level at which a word line 272 (refer to FIG. 12) may be formed subsequently. The first insulation layer 120 adjacent to the second sacrificial layer 130 at which the GSL 276 or the SSL 274 may be formed subsequently may have also a thickness larger than that of the first insulation layer 120 adjacent to the second sacrificial layer 130 at which the word line 272 may be formed subsequently.

The number of the first insulation layers 120 and the number of the second sacrificial layers 130 stacked on the first sacrificial layer 110 may vary according to the desired number of the GSL 276, the word line 272 and the SSL 274. According to at least one embodiment, each of the GSL 276 and the SSL 274 may be formed at 2 levels, and the word line 272 may be formed at 4 levels. The second sacrificial layer 130 may be formed at 8 levels, and the first insulation layer 120 may be formed at 9 levels. According to at least one example embodiment, each of the GSL 276 and the SSL 274 may be formed at a single level, and the word line 272 may be formed at 2, 8 or 16 levels. In this case, the second sacrificial layer 130 may be formed at 4, 10 or 18 levels, and the first insulation layer 120 may be formed at 5, 11 or 19 levels. However, the number of included layers is described for purposes of example and is not limited according to example embodiments.

Figure 4:
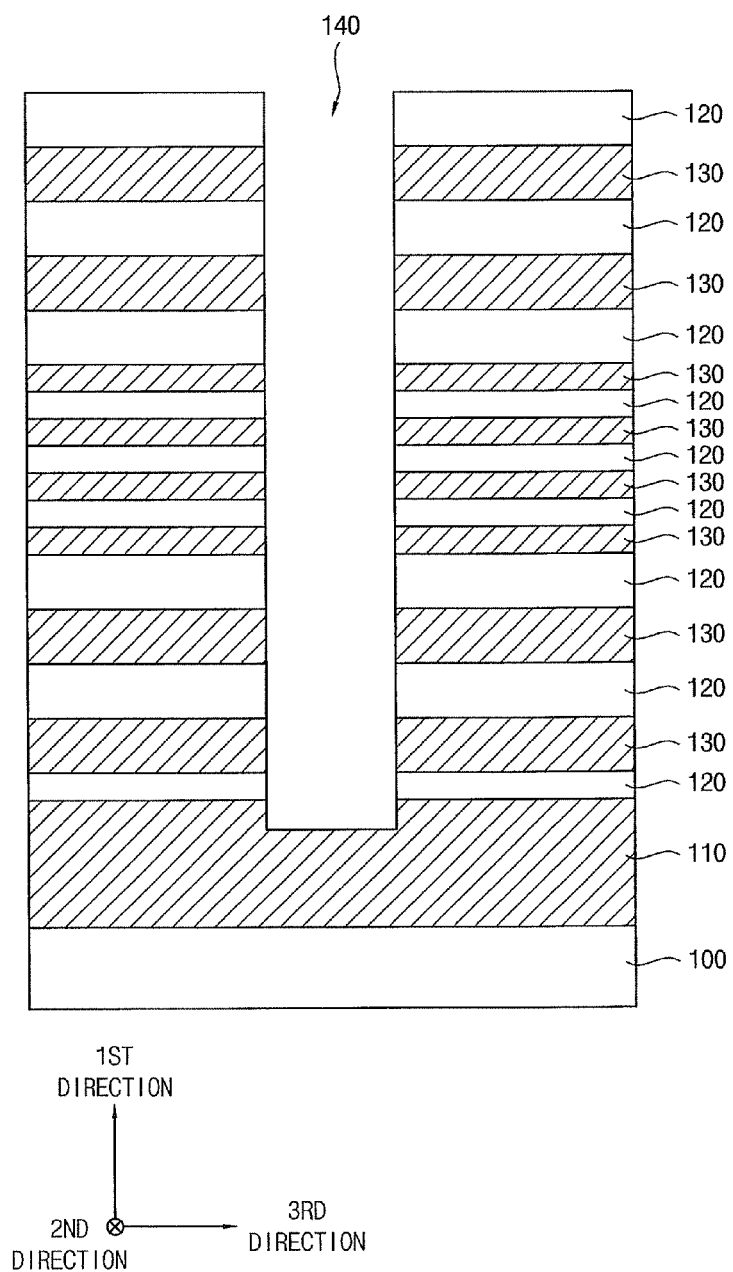
Figure 15:
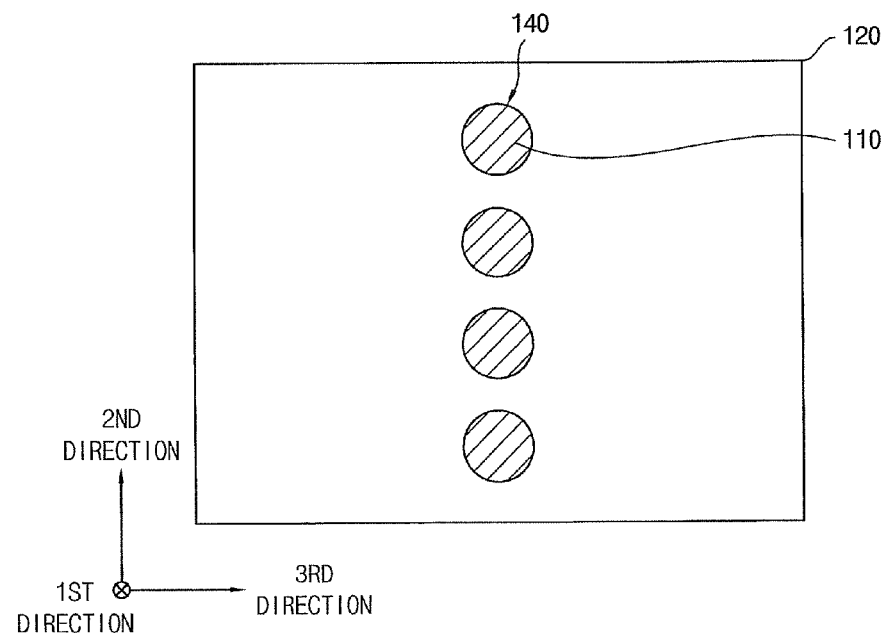

Referring to FIGS. 4 and 15, a first opening 140 may be formed through the first insulation layer 120 and the second sacrificial layer 130 to expose the first sacrificial layer 110. According to example embodiments, when the first opening 140 is formed, an upper portion of the first sacrificial layer 110 may be also removed. According to example embodiments, after forming a hard mask (not shown) on an uppermost first insulation layer 120, the first insulation layers 120 and the second sacrificial layers 130 may be, for example, dry etched using the hard mask as an etch mask to form the first opening 140. The first opening 140 may extend in a first direction substantially perpendicular to a top surface of the substrate 100. Due to the characteristics of a dry etch process, a width of the first opening 140 may become gradually smaller from a top portion to a bottom portion thereof.

According to example embodiments, a plurality of first openings 140 may be formed in a second direction substantially parallel to the top surface of the substrate 100 to define a first opening column, and a plurality of first opening columns may be formed in a third direction substantially perpendicular to the second direction to define a first opening array.

Figure 5:
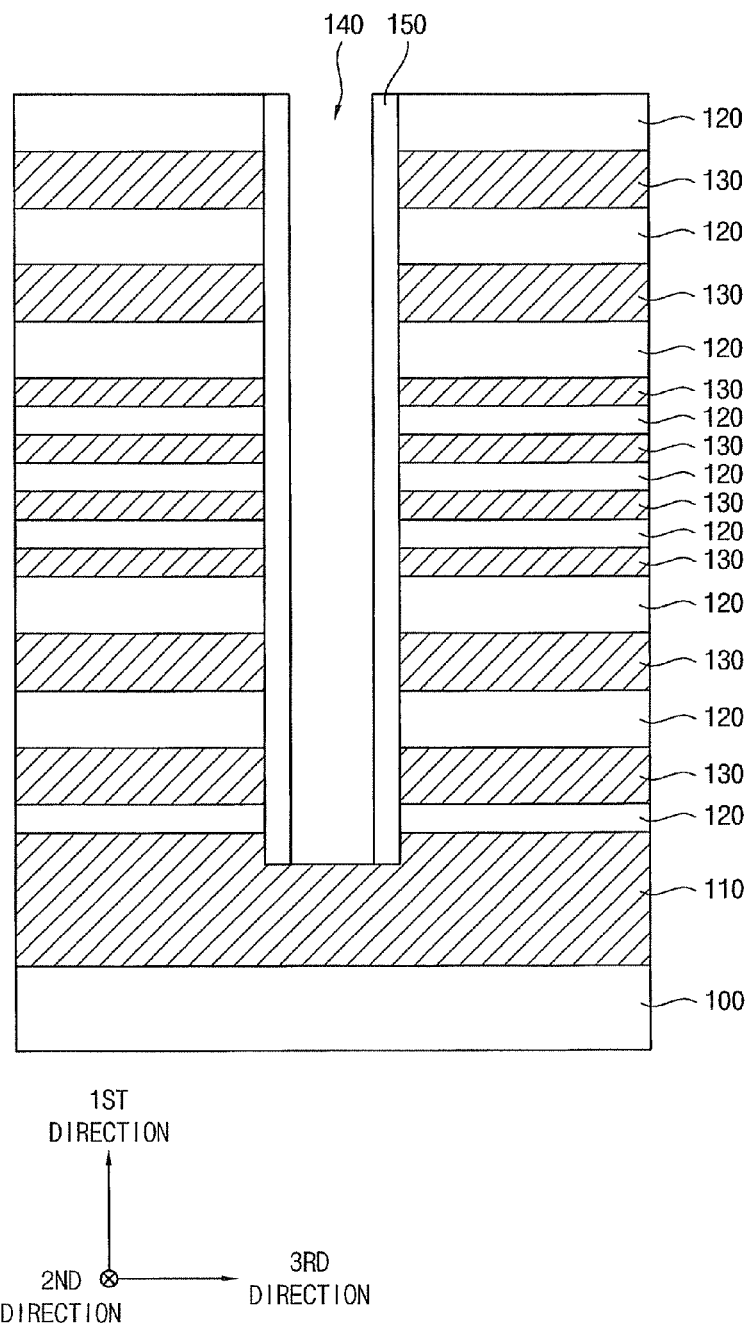
Figure 6:
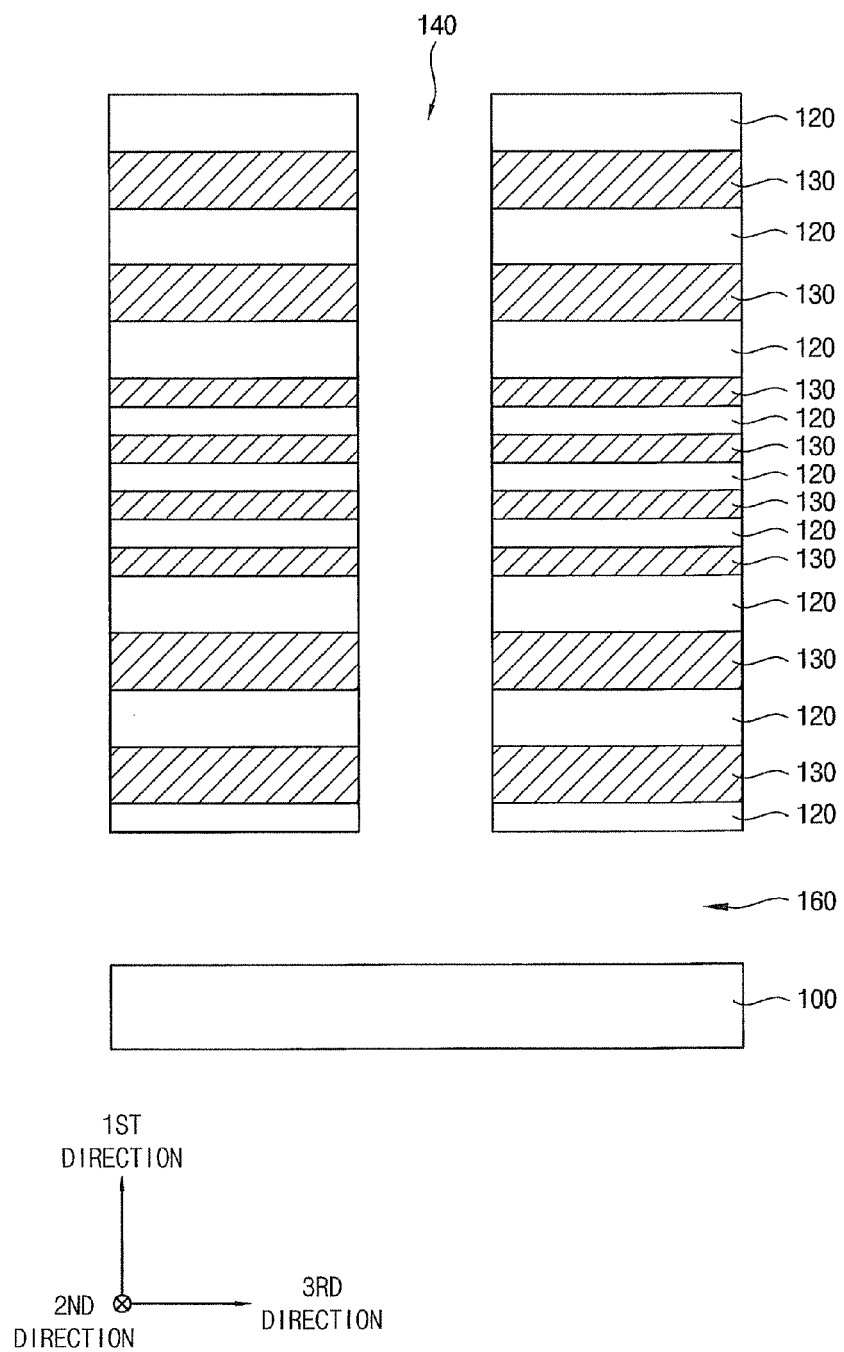

Referring to FIGS. 5 and 16, an etch stop layer 150 may be formed on a sidewall of the first opening 140. According to example embodiments, the etch stop layer 150 may be formed to include a material with etch selectivity to the first insulation layer 120 and the first and second sacrificial layers 110 and 130 (e.g., polysilicon). Referring to FIGS. 6 and 17, the first sacrificial layer 110 may be removed to form a first gap 160 in fluid communication with the first opening 140. The etch stop layer 150 may be removed. According to example embodiments, the first sacrificial layer 110 may be removed by, for example, a wet etch process, and the first insulation layer 120 and the sacrificial layer 130 may not be removed due to the etch stop layer 150. The first sacrificial layer 110 may be removed only in the cell region adjacent to the first opening 140, and a structure including the first insulation layer 120 and the sacrificial layer 130 may not fall down.

Figure 7:
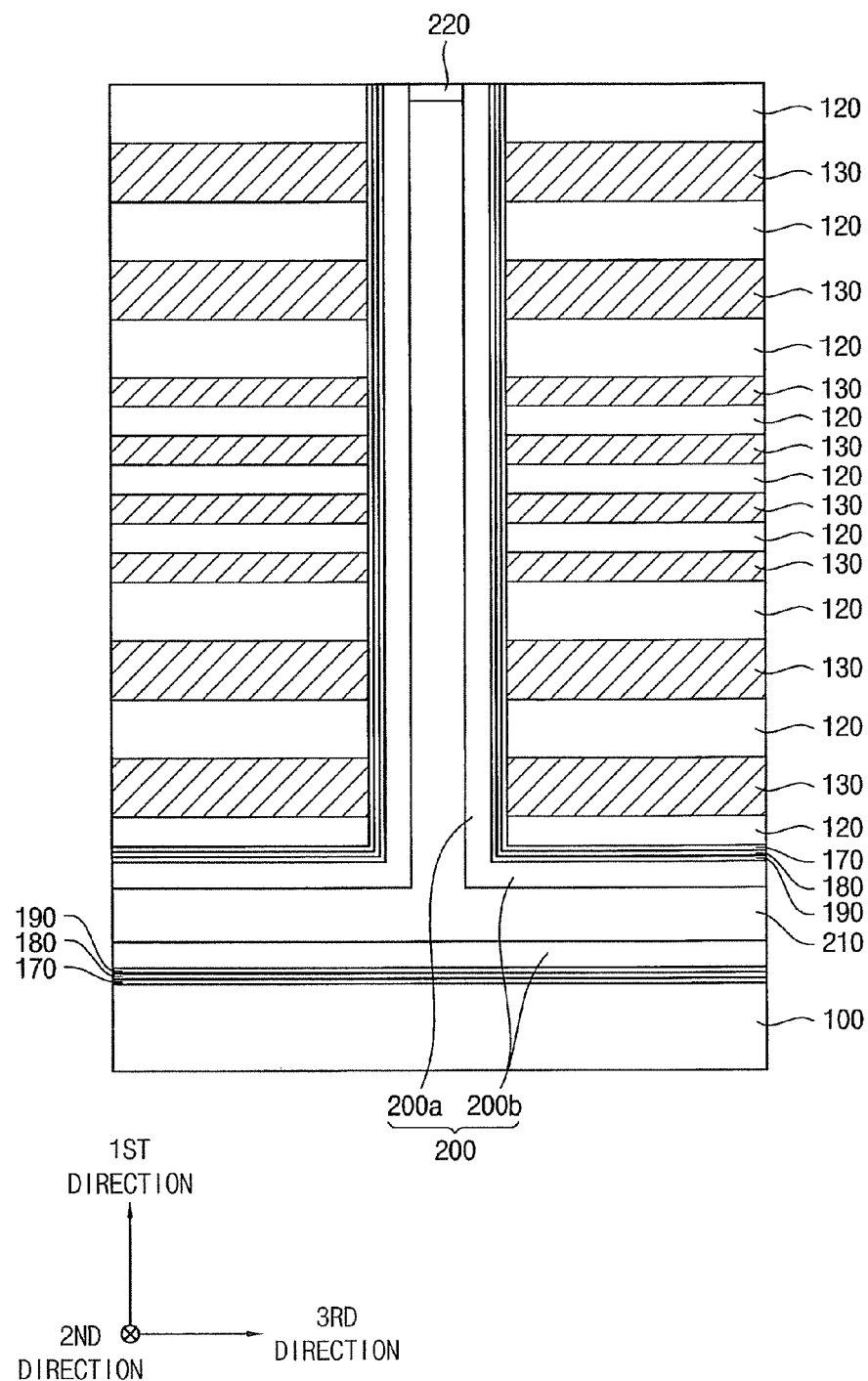
Figure 18:
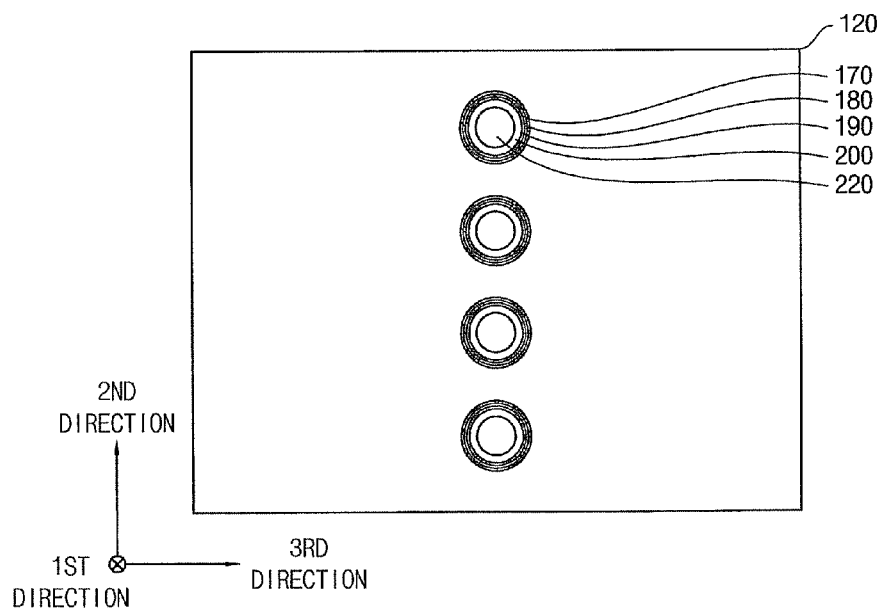

Referring to FIGS. 7 and 18, a first blocking layer 170, a first charge trapping layer 180, a first tunnel insulation layer 190 and a first channel layer 200 may be sequentially formed on inner walls of the first opening 140 and the first gap 160, and a first filling layer 210 may be formed on the first channel layer 200 to fill remaining portions of the first opening 140 and the first gap 160.

After sequentially forming the first blocking layer 170, the first charge trapping layer 180, the first tunnel insulation layer 190 and the first channel layer 200 on the inner walls of the first opening 140 and the first gap 160, the first filling layer 210 may be formed on the first channel layer 200 to fill the remaining portions of the first opening 140 and the first gap 160, and upper portions of the first filling layer 210, the first channel layer 200, the first tunnel insulation layer 190, the first charge trapping layer 180 and the first blocking layer 170 may be planarized until a top surface of the uppermost first insulation layer 120 is exposed. According to example embodiments, the first blocking layer 170, the first charge trapping layer 180, the first tunnel insulation layer 190, the first channel layer 200 and the first filling layer 210 may be formed by, for example, a CVD process, a PECVD process and/or an ALD process. The planarization process may be performed by, for example, a chemical mechanical polishing (CMP) process.

The first blocking layer 170 may be formed to include, for example, a silicon oxide and/or a metal oxide. For example, the metal oxide may be an aluminum oxide, hafnium oxide, lanthanum oxide, lanthanum aluminum oxide, lanthanum hafnium oxide, hafnium aluminum oxide, titanium oxide, tantalum oxide and/or zirconium oxide. According to at least one example embodiment, the first blocking layer 170 may be formed as a multi-layered structure of, for example, a silicon oxide layer and a metal oxide layer. The first charge trapping layer 180 may be formed to include, for example, a nitride (e.g., a silicon nitride and/or a metal oxide). The first tunnel insulation layer 190 may be formed to include, for example, a silicon oxide.

The first channel layer 200 may be formed to include a semiconductor, for example, doped polysilicon, single crystalline silicon and/or amorphous silicon. If a first channel layer 200 is formed using amorphous silicon, a laser epitaxial growth (LEG) process and/or a solid phase epitaxy (SPE) process may be performed to convert the amorphous silicon into single crystalline silicon. The first filling layer 210 may be formed to include, for example, an insulating material (e.g., an oxide).

The first channel layer 200 may be formed to include a first vertical portion 200a of a hollow cylindrical shape on a sidewall inside of the first opening 140, and a first horizontal portion 200b including two plates spaced apart from each other on the wall inside the first gap 160. According to example embodiments, a plurality of first vertical portion columns or a plurality of first vertical portion arrays may be formed in correspondence to the first opening column or the first opening array. According to at least one example embodiment, the first channel layer 200 may include a pillar shaped first vertical portion 200a in the first opening 140, and a first horizontal portion 200b including a single plate in the first gap 160. In this case, the first filling layer 210 may not be formed.

An upper portion of the first filling layer 210 may be removed to expose an upper portion of the first channel layer 200, and a pad 220 may be formed on the first filling layer 210 to cover the exposed upper portion of the first channel layer 200 and fill a remaining portion of the first opening 140. The upper portion of the first filling layer 210 may be removed by, for example, an etch back process. A pad layer (not shown) may be formed on the first filling layer 210 and the uppermost first insulation layer 120 to fill the remaining portion of the first opening 140, and the pad layer may be planarized until a top surface of the uppermost first insulation layer 120 is exposed to form the pad 220. According to example embodiments, the pad layer may be formed to include, for example, doped polysilicon. The planarization process may be performed by, for example, a CMP process.

Edge portions of the first insulation layer 120 and the second sacrificial layer 130 may be removed (e.g., trimmed so that an area of the first insulation layer 120 and the second sacrificial layer 130 may become smaller from a bottom level to a top level).

Figure 8:
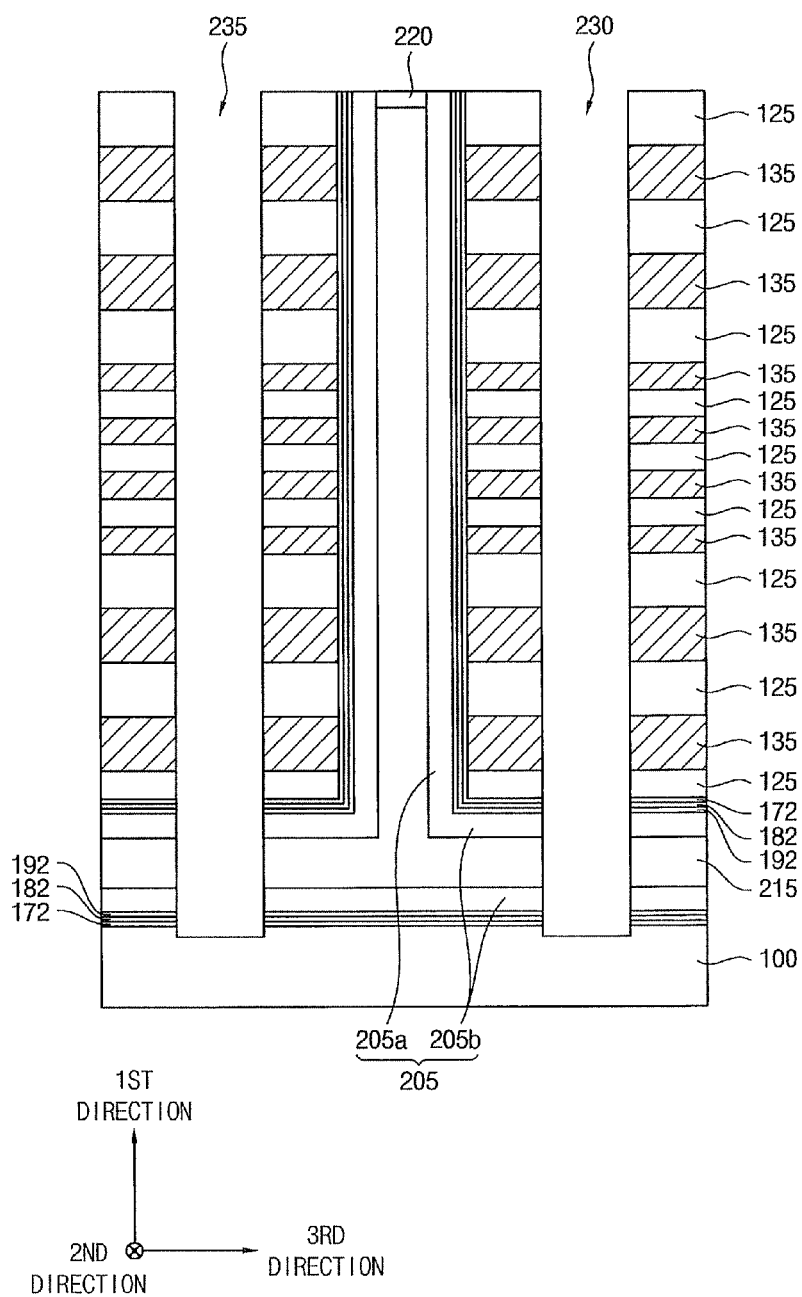
Figure 19:
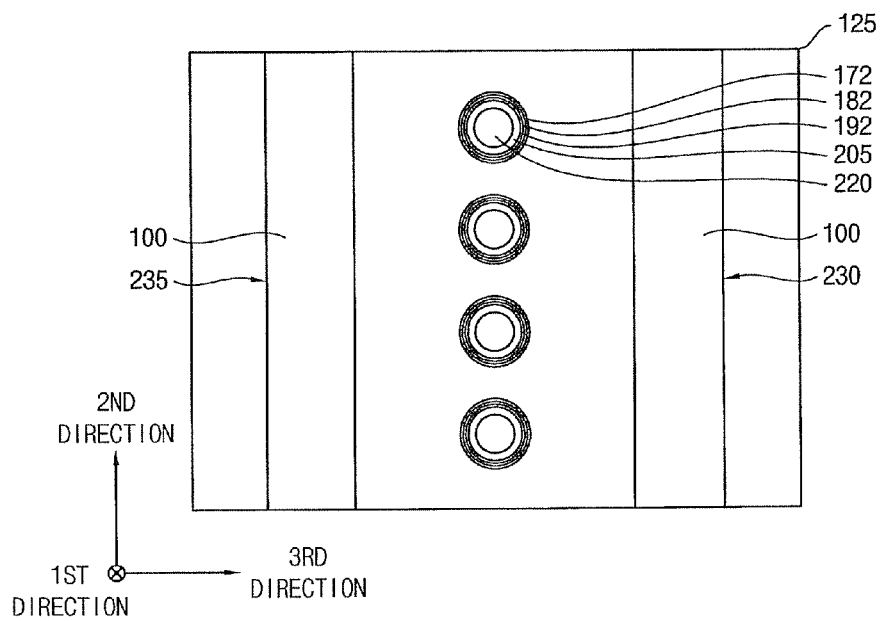

Referring to FIGS. 8 and 19, second and third openings 230 and 235 may be formed through the first insulation layer 120, the second sacrificial layer 130, the first blocking layer 170, the first charge trapping layer 180, the first tunnel insulation layer 190, the first channel layer 200 and the first filling layer 210 to expose a top surface of the substrate 100. According to example embodiments, when the second and third openings 230 and 235 are formed, an upper portion of the substrate 100 may be also removed.

According to example embodiments, after forming a hard mask (not shown) on the uppermost first insulation layer 120, the first insulation layer 120, the second sacrificial layer 130, the first blocking layer 170, the first charge trapping layer 180, the first tunnel insulation layer 190, the first channel layer 200 and the first filling layer 210 may be, for example, dry etched using the hard mask as an etch mask to form the second and third openings 230 and 235. Each of the second and third openings 230 and 235 may extend in the first direction.

According to example embodiments, each of the second and third openings 230 and 235 may be formed to extend in the second direction, and a plurality of second openings 230 and a plurality of third openings 235 may be formed in the third direction. According to example embodiments, one second opening 230 and one third opening 235 may be formed before and after the first vertical portion 200a of the first channel layer 200, respectively, in the third direction.

The first insulation layer 120, the second sacrificial layer 130, the first blocking layer 170, the first charge trapping layer 180, the first tunnel insulation layer 190, the first channel layer 200 and the first filling layer 210 may be transformed into a first insulation layer pattern 125, a second sacrificial layer pattern 135, a first blocking layer pattern 172, a first charge trapping layer pattern 182, a first tunnel insulation layer pattern 192, a first channel 205 and a first filling layer pattern 215, respectively. The first channel 205 may include a first vertical portion 205a and a first horizontal portion 205b.

Figure 9:
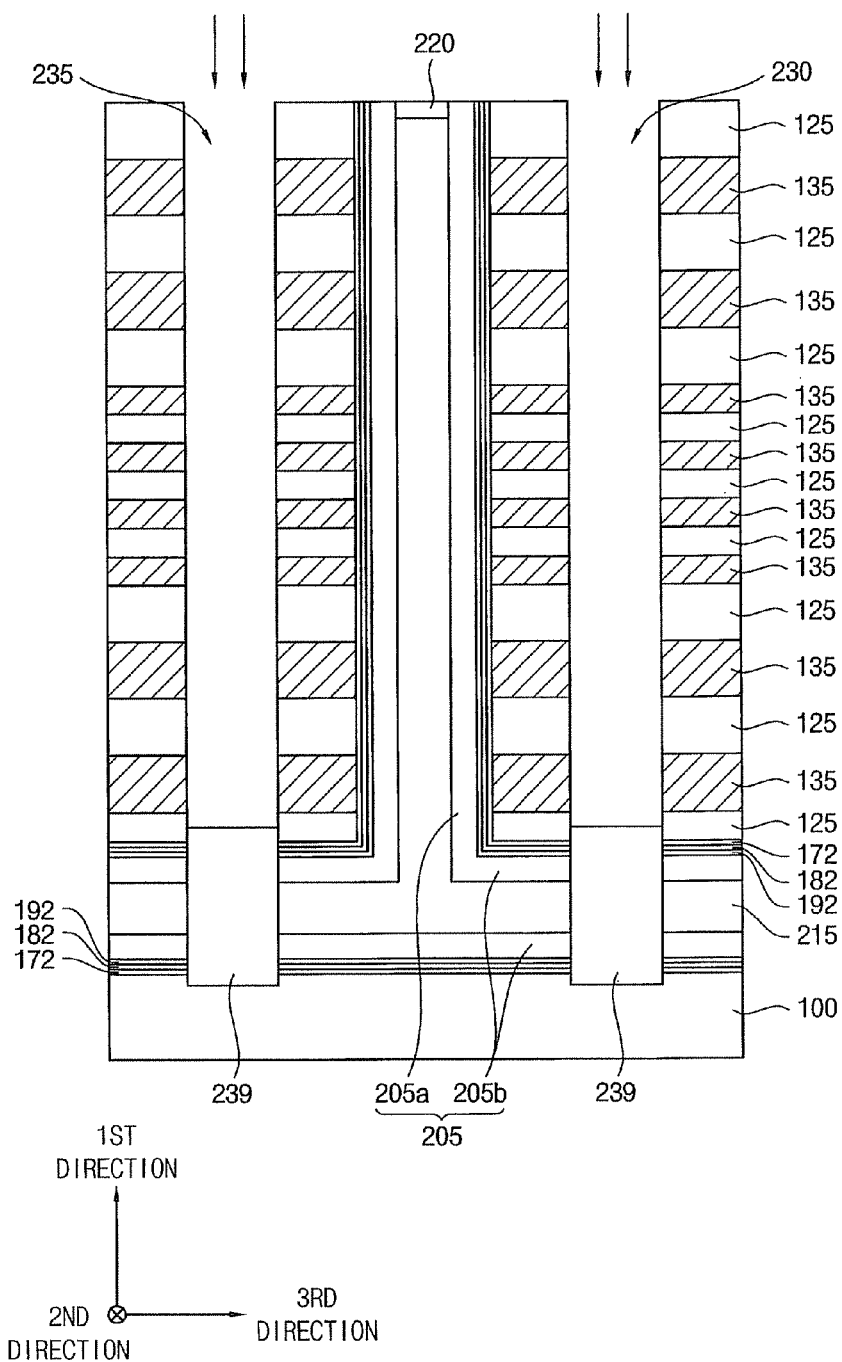
Figure 20:
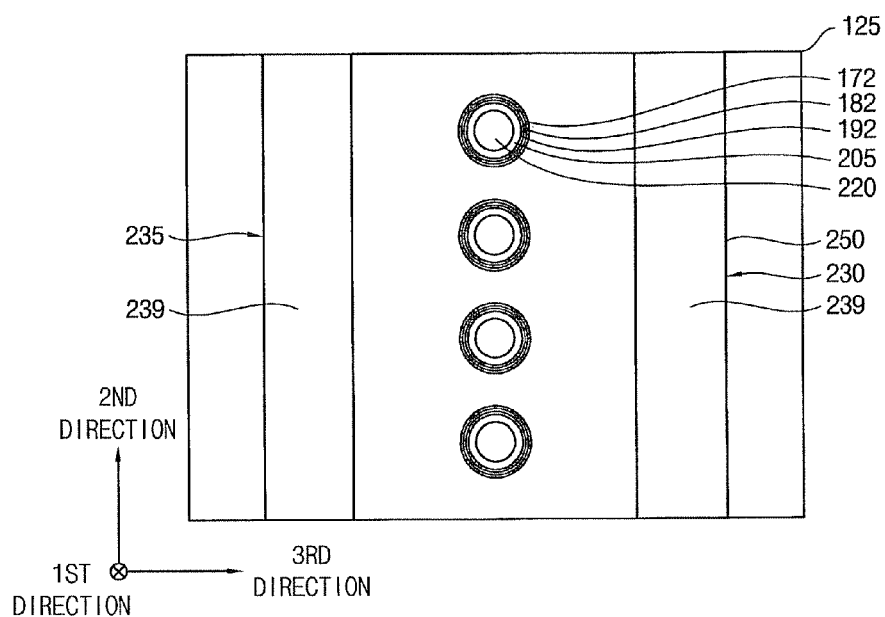

Referring to FIGS. 9 and 20, a contact layer 239 may be formed on the exposed top surface of the substrate 100 to partially fill the second and third openings 230 and 235. According to example embodiments, the contact layer 239 may be formed by, for example, a selective epitaxial growth (SEG) process using the exposed top surface of the substrate 100 as a seed layer. The contact layer 239 may be doped with impurities (e.g., p-type impurities). According to example embodiments, a height of the contact layer 239 may be greater than that of the first horizontal portion 205b of the first channel 205 and less than that of a lowermost second sacrificial layer pattern 135. As each of the second and third openings 230 and 235 is formed to extend in the second direction, the contact layer 239 may also be formed to extend in the second direction.

Figure 10:
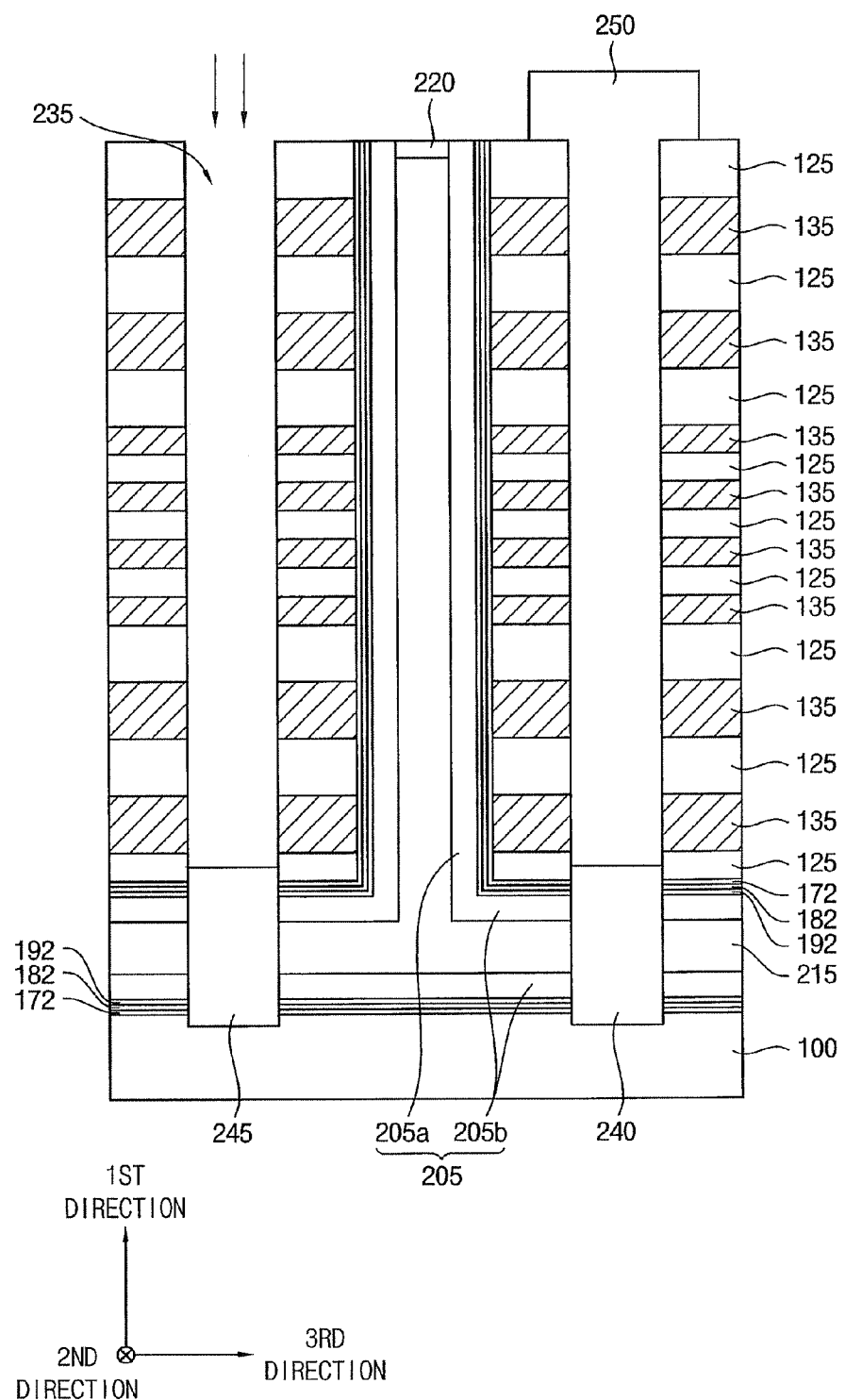
Figure 21:
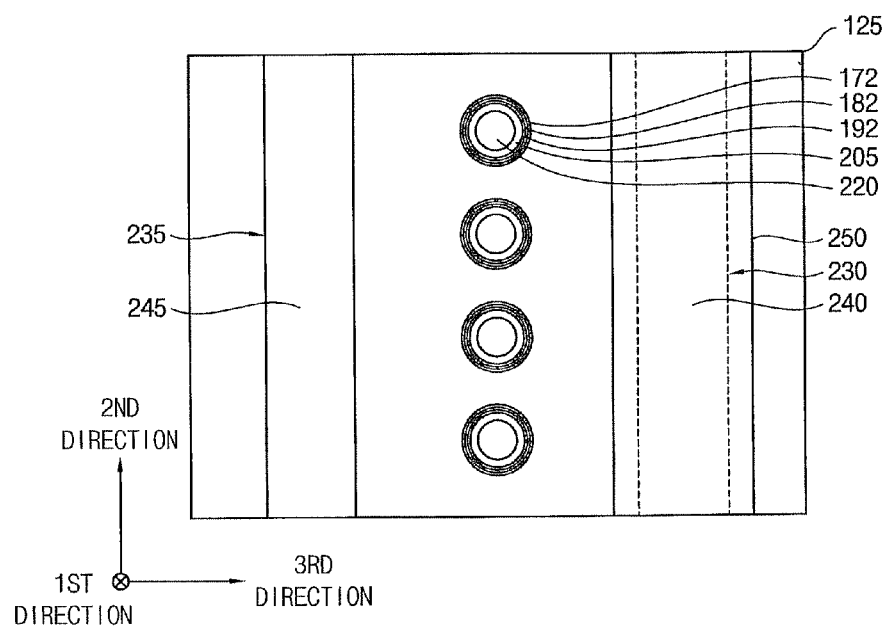

Referring to FIGS. 10 and 21, an ion implantation mask 250 may be formed on a first portion of the contact layer 239 and the first insulation layer pattern 125 to fill a remaining portion of the second opening 230. Impurities may be implanted into a second portion of the contact layer 239 in the third opening 235. According to example embodiments, n-type impurities may be doped into the second portion of the contact layer 239. Hereinafter, the first portion of the contact layer 239 in the second opening 230 may be defined as a first contact 240, and the second portion of the contact layer 239 in the third opening 235 may be defined as a second contact 245. Each of the first and second contacts 240 and 245 may extend in the second direction.

Figure 11:
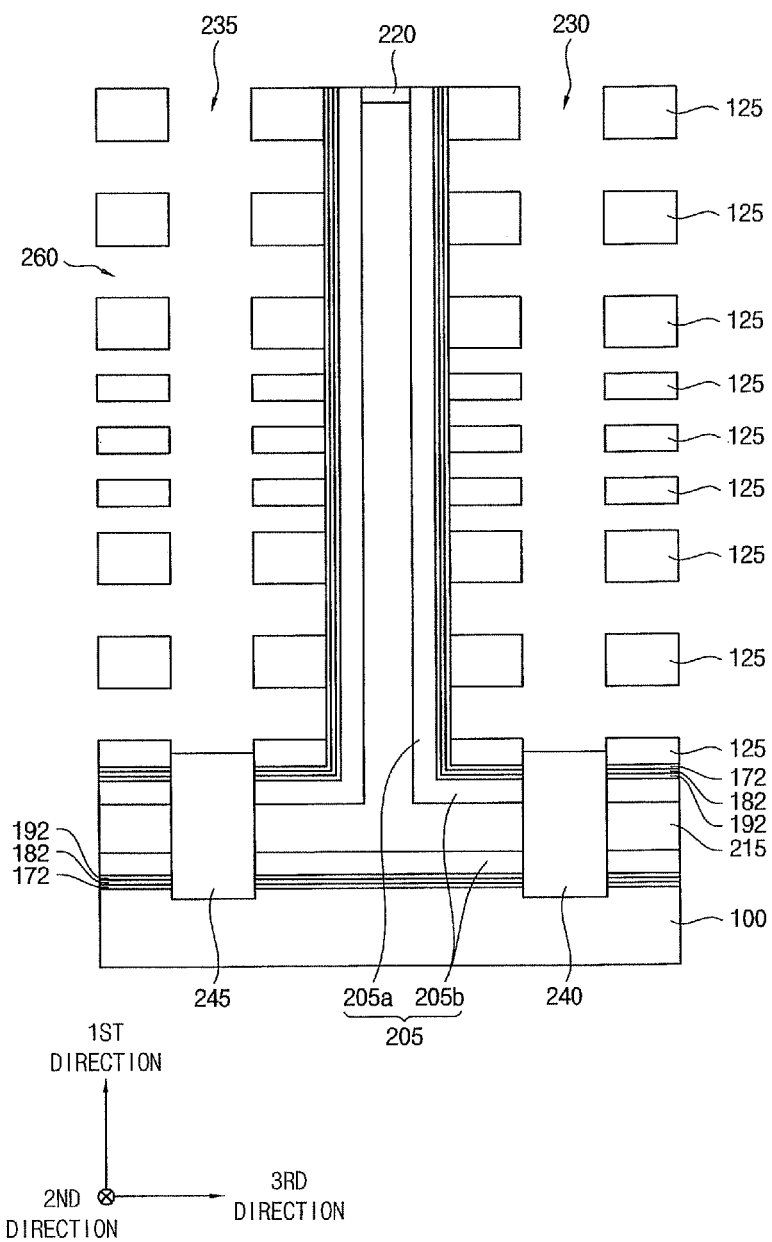
Figure 22:
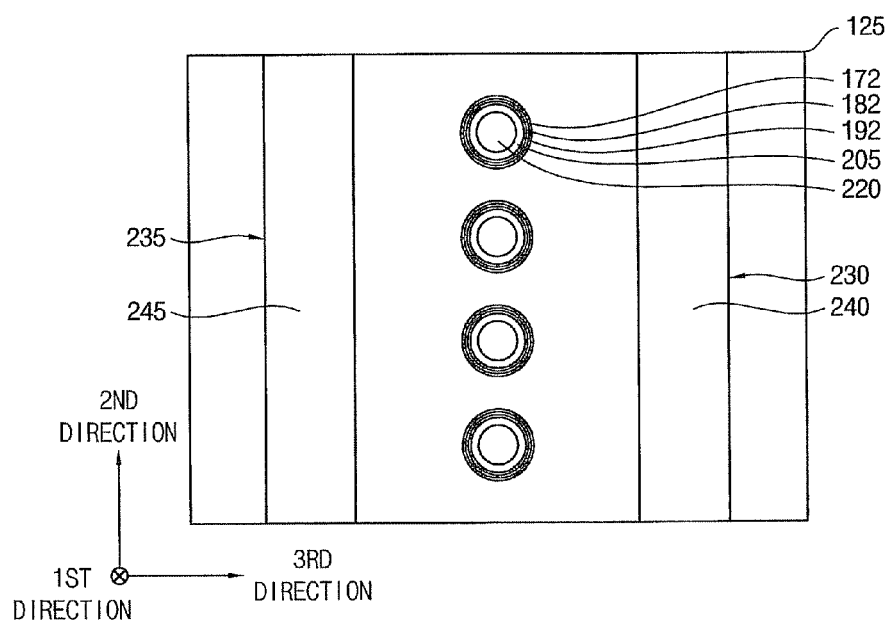

Referring to FIGS. 11 and 22, after removing the ion implantation mask 250, the second sacrificial layer patterns 135 exposed by the second and third openings 230 and 235 may be removed to form a second gap 260 between the first insulation layer patterns 125 at adjacent levels. According to example embodiments, a plurality of second gaps 260 may be formed between the first insulation layer patterns 125, respectively. A sidewall of the first blocking layer pattern 172 may be exposed by the second gap 260. According to example embodiments, the second sacrificial layer patterns 135 may be removed by, for example, a wet etch process using an etch solution including, for example, phosphoric acid and/or sulfuric acid.

Figure 12:
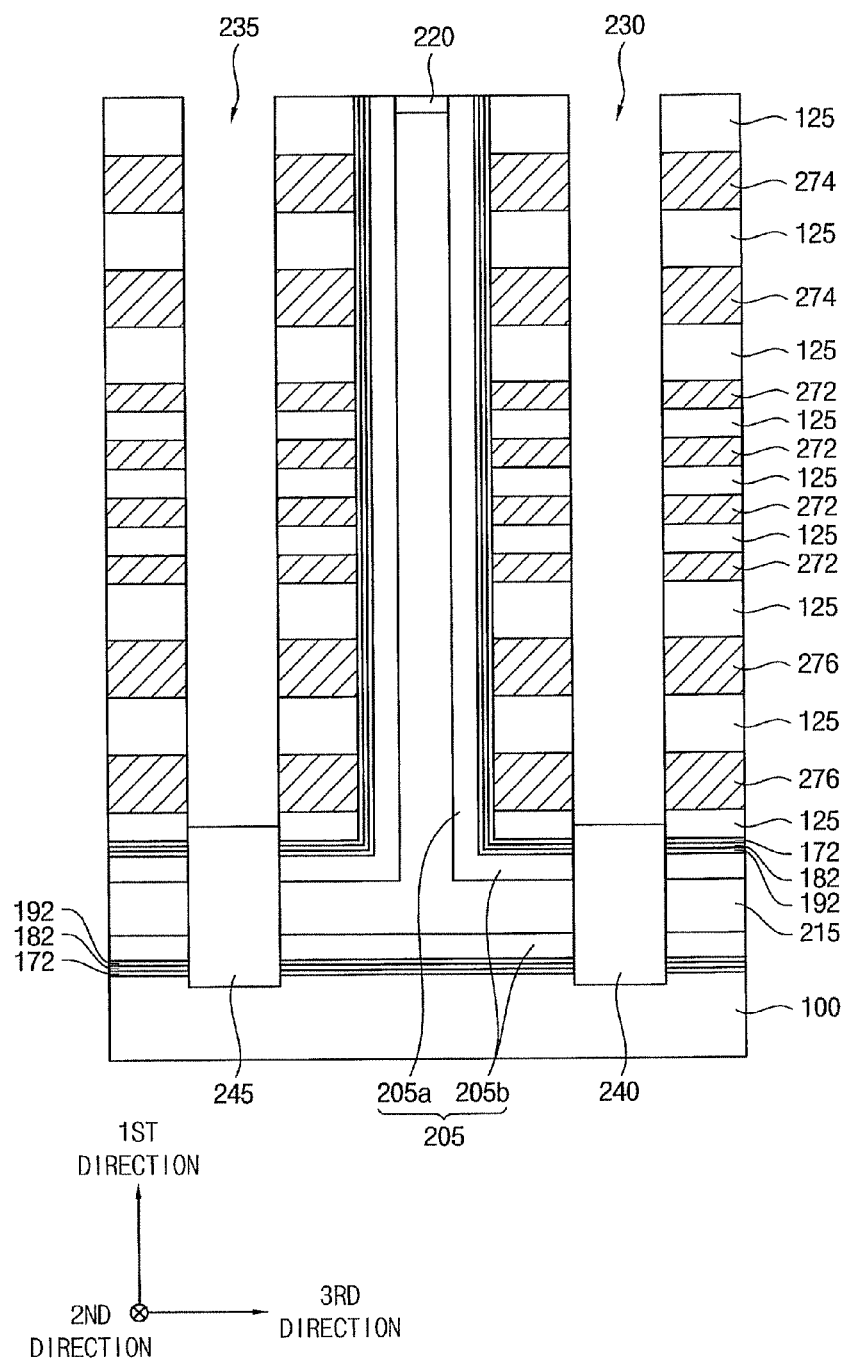

Referring to FIG. 12, the GSL 276, the word line 272 and the SSL 274 filling the second gap 260 may be formed. A gate electrode layer (not shown) filling the second gap 260 may be formed on the sidewall of the first blocking layer pattern 172, a surface of the first insulation layer pattern 125, top surfaces of the first and second contacts 240 and 245, a top surface of the first channel 205, a top surface of the pad 220, and top surfaces of the first blocking layer pattern 172, the first charge trapping layer pattern 182 and the first tunnel insulation layer pattern 192.

According to example embodiments, the gate electrode layer may be formed to include, for example, a metal and/or a metal nitride. For example, the gate electrode layer 250 may be formed using a metal and/or a metal nitride with low electrical resistance (e.g., tungsten, tungsten nitride, titanium, titanium nitride, tantalum, tantalum nitride and/or platinum). According to at least one example embodiment, the gate electrode layer may be formed as a multi-layer structure including a barrier layer (e.g., including a metal nitride) and a metal layer (e.g., including a metal).

The gate electrode layer may be partially removed to form the GSL 276, the word line 272 and the SSL 274 in each second gap 260. According to example embodiments, the gate electrode layer may be partially removed by, for example, a wet etch process. Each of the GSL 276, the word line 272 and the SSL 274 may be formed at a single level or at a plurality of levels. According to at least one example embodiment, each of the GSL 276 and the SSL 274 may be formed at 2 levels, and the word line 272 may be formed at 4 levels between the GSL 276 and the SSL 274. Each of the GSL 276, the word line 272 and the SSL 274 in each level may be formed to extend in the second direction.

Figure 13:
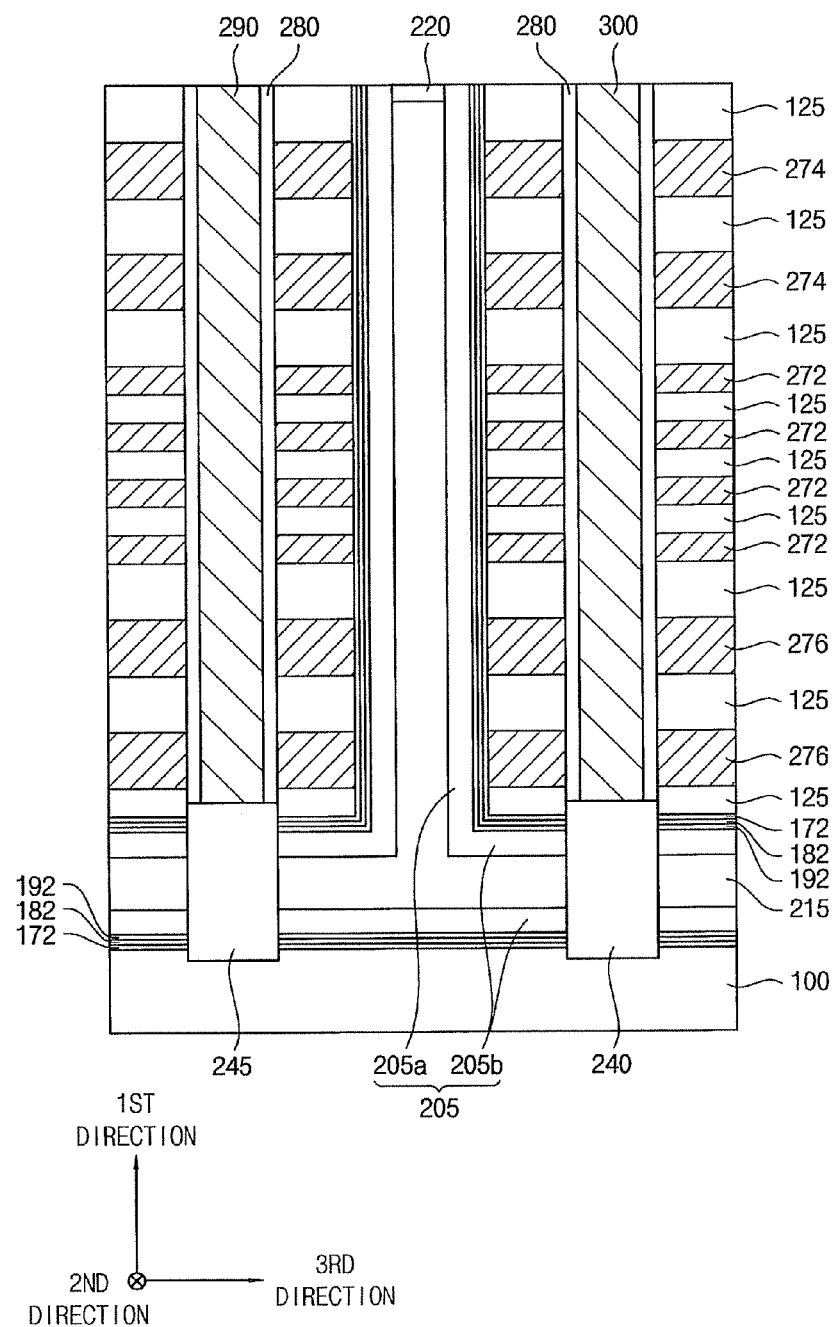
Figure 14:
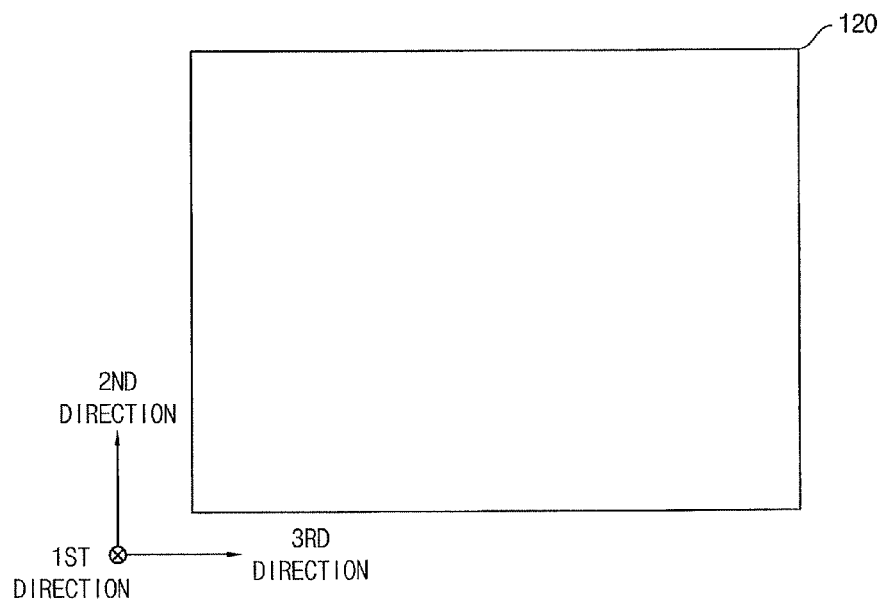
Figure 23:
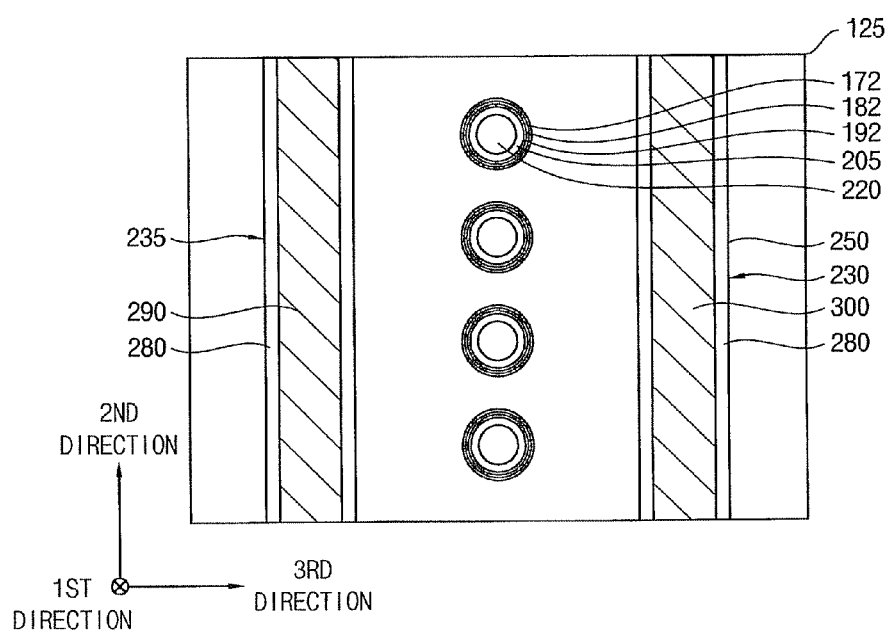

Referring to FIGS. 13 and 23, a second insulation layer pattern 280 may be formed on sidewalls inside the second and third openings 230 and 235, and a bulk line 300 and a common source line (CSL) 290 filling remaining portions of the second and third openings 230 and 235, respectively, may be formed. A second insulation layer (not shown) may be formed on sidewalls inside the second and third openings 230 and 235, top surfaces of the first and second contacts 240 and 245, a top surface of the first insulation layer 125, a top surface of the first channel 205, a top surface of the pad 220, and top surfaces of the first blocking layer pattern 172, the first charge trapping layer pattern 182 and the first tunnel insulation layer pattern 192. Portions of the second insulation layer on the top surfaces of the first and second contacts 240 and 245, the top surface of the first insulation layer 125, the top surface of the first channel 205, the top surface of the pad 220, and the top surfaces of the first blocking layer pattern 172, the first charge trapping layer pattern 182 and the first tunnel insulation layer pattern 192 may be removed to form the second insulation layer pattern 280 on the inner walls of the second and third openings 230 and 235.

A conductive layer (not shown) filling remaining portions of the second and third openings 230 and 235 may be formed on the first and second insulation layer patterns 125 and 280, the first and second contacts 240 and 245, the first channel 205, the pad 220, the first blocking layer pattern 172, the first charge trapping layer pattern 182 and the first tunnel insulation layer pattern 192. An upper portion of the conductive layer may be planarized until a top surface of the first insulation layer pattern 125 is exposed to form the bulk line 300 and the CSL 290 in the second and third openings 230 and 235, respectively. As each of the second and third openings 230 and 235 may extend in the second direction, each of the bulk line 300 and the CSL 290 may extend in the second direction. According to example embodiments, one bulk line 300 and one CSL 290 may be formed before and after the first channel 205, respectively, in the third direction. According to example embodiments, the conductive layer may be formed to include, for example, doped polysilicon, a metal and/or a metal nitride.

Referring to FIGS. 1 and 2, a third insulation layer 310 may be formed on the first and second insulation layer patterns 125 and 280, the CSL 290, the bulk line 300, the first channel 205, the pad 220, the first blocking layer pattern 172, the first charge trapping layer pattern 182 and the first tunnel insulation layer pattern 192. A fourth opening (not shown) exposing a top surface of the pad 220 and fifth openings (not shown) exposing top surfaces of the CSL 290 and the bulk line 300 may be formed through the third insulation layer 310. According to example embodiments, a plurality of fourth openings corresponding to the pads 220 may be formed in the second direction to define a fourth opening column, and a plurality of fourth opening columns may be formed in the third direction to define a fourth opening array. One or a plurality of fifth openings may be formed on each CSL 290 and each bulk line 300.

A bit line contact 320 may be formed on the pad 220, the CSL 290 and the bulk line 300 to fill the fourth and fifth openings. The bit line contact 320 may be formed to include, for example, a metal, a metal nitride and/or doped polysilicon. A bit line 330 electrically connected to the bit line contact 320 may be formed to complete the vertical memory device. The bit line 320 may be formed to include, for example, a metal, a metal nitride and/or doped polysilicon. According to example embodiments, the bit line 320 may be formed to extend in the third direction.

According to example embodiments, after forming the first sacrificial layer 110 on the substrate 100 and alternately and repeatedly forming the first insulation layer 120 and the second sacrificial layer 130 on the first sacrificial layer 110, the first opening 140 may be formed through the first insulation layer 120 and the second sacrificial layer 130 to expose the first sacrificial layer 110. The sacrificial layer 110 exposed by the first opening 140 may be removed to form the first gap 160, and the first channel 205 having the first vertical portion 205a and the first horizontal portion 205b may be formed in the first opening 140 and the first gap 160. The second and third openings 230 and 235 may be formed through the first insulation layer 120, the second sacrificial layer 130 and the first horizontal portion 205b of the first channel 205 to expose a top surface of the substrate 100, and an SEG process may be performed using the exposed top surface of the substrate 100 as a seed layer to form the first and second contacts 240 and 245 so that the first channel 205 may be electrically connected to the substrate 100. The bulk line 300 and the CSL 290 electrically connected to the first and second contacts 240 and 245, respectively, may be formed to be electrically connected to the substrate 100.

The first channel 205 may be formed to be electrically connected to the substrate 100 without being damaged during the formation of the first channel 205, and connected to the CSL 290 and the bulk line 300 via the first and second contacts 240 and 245. The electrical connections may be improved.

Figure 24:
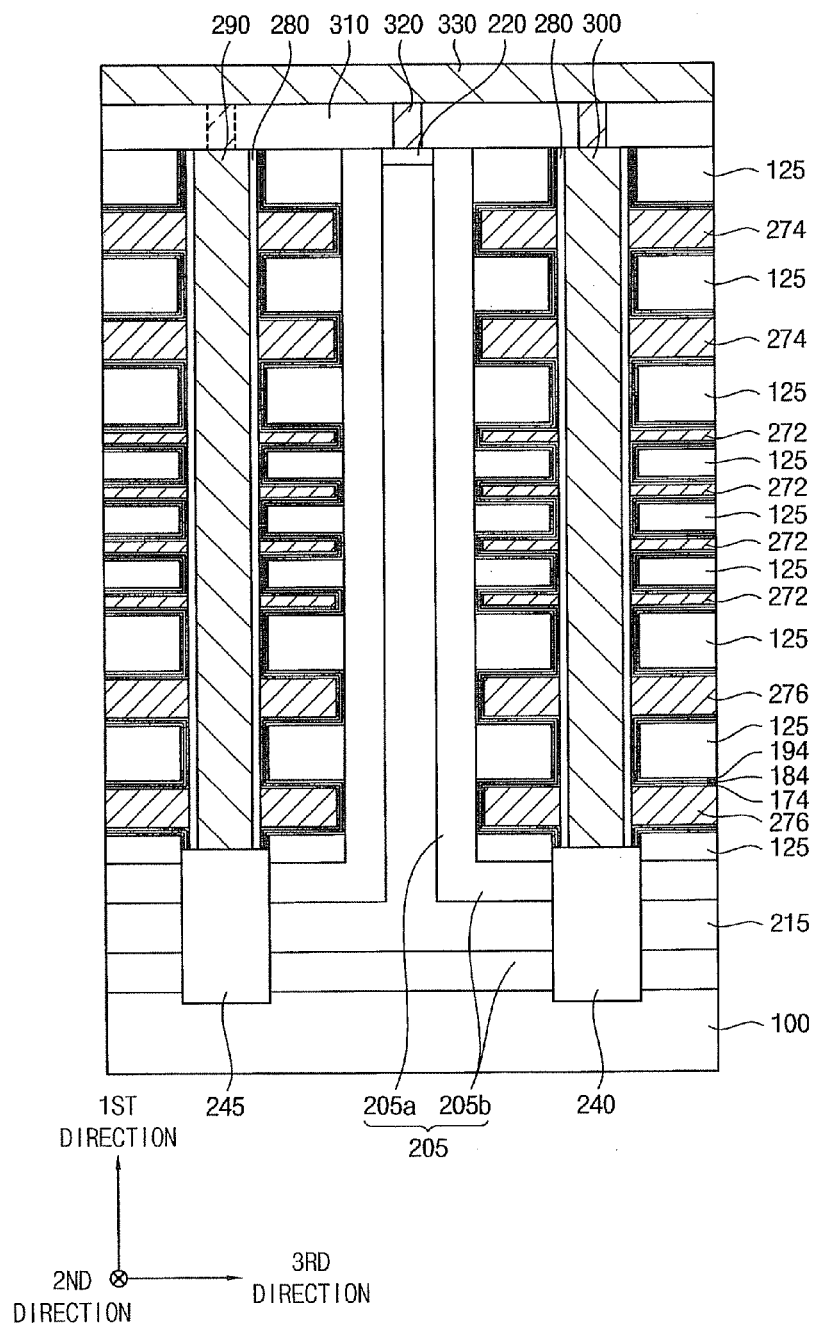
FIGS. 24 and 25 are a cross-sectional diagram and a plan diagram, respectively, illustrating vertical memory devices in accordance with other example embodiments.
Figure 25:
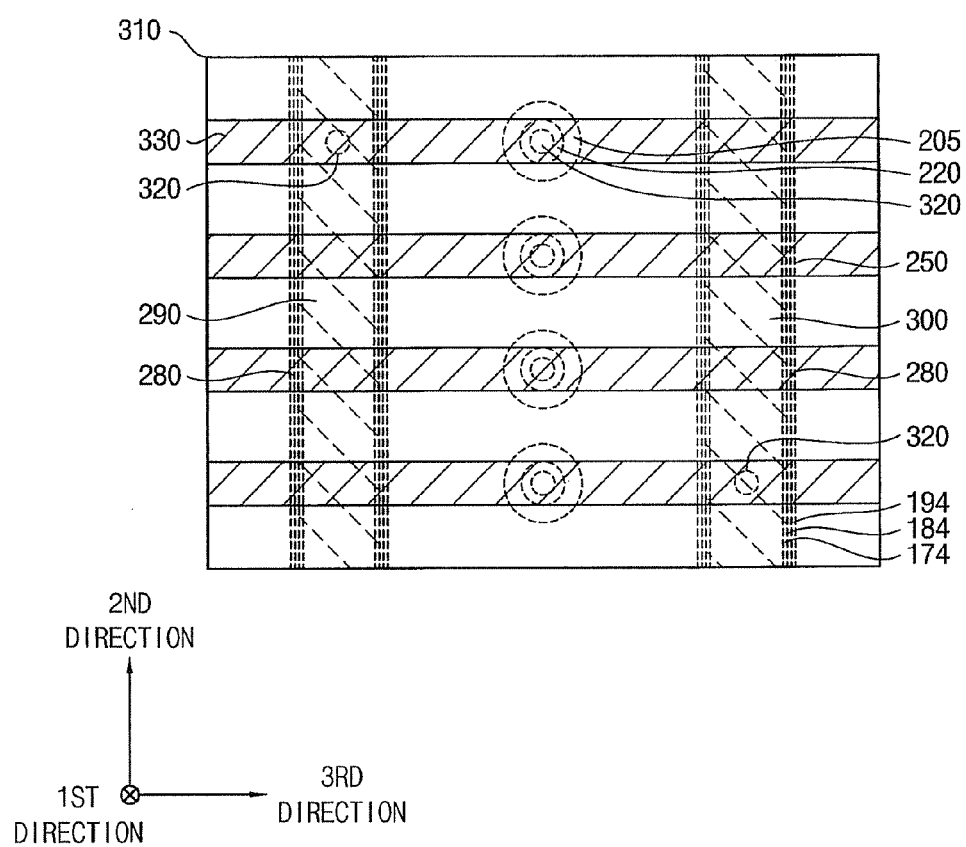

FIGS. 24 and 25 are a cross-sectional diagram and a plan diagram, respectively, illustrating vertical memory devices in accordance with other example embodiments. The vertical memory device of FIG. 24 may be substantially the same as or similar to that of FIGS. 1 and 2 except for the positions and shapes of a tunnel insulation layer pattern, a charge trapping layer pattern and a blocking layer pattern, and thus repetitive explanations thereabout may be omitted herein. Referring to FIGS. 24 and 25, a vertical memory device may include a first channel 205, a GSL 276, a word line 272, an SSL 274, first and second contacts 240 and 245, a CSL 290 and a bulk line 300 on a substrate 100. The vertical memory device may further include a bit line 330.

The GSL 276, the word line 272 and the SSL 274 may be formed on an outer sidewall of a first vertical portion 205a of the first channel 205 sequentially in a first direction substantially perpendicular to a top surface of the substrate 100, and spaced apart from each other. Each of the GSL 276, the word line 272 and the SSL 274 may be formed at one level or more than one levels, and a first insulation layer pattern 125 may be interposed therebetween. According to example embodiments, each of the GSL 276, the word line 272 and the SSL 274 may extend in a second direction substantially parallel to a top surface of the substrate 100, and a plurality of GSLs 276, a plurality of word lines 272, and a plurality of SSLs 274 may be formed in a third direction substantially perpendicular to the second direction.

A second tunnel insulation layer pattern 194, a second charge trapping layer pattern 184 and a second blocking layer pattern 174 may be formed between the outer sidewall of the first vertical portion 205a of the first channel 205 and each of the GSL 276, the word line 272 and the SSL 274 sequentially in a direction substantially perpendicular to the outer sidewall of the first vertical portion 205a (e.g., in the third direction). The second tunnel insulation layer pattern 194, the second charge trapping layer pattern 184 and the second blocking layer pattern 174 may be formed between the first insulation layer pattern 125 and each of the GSL 276, the word line 272 and the SSL 274, and formed between the first insulation layer pattern 125 and a second insulation layer pattern 280.

FIGS. 26-29 are cross-sectional diagrams illustrating methods of manufacturing a vertical memory device of FIGS. 24 and 25 in accordance with example embodiments. FIGS. 30-33 are plan views illustrating methods of manufacturing a vertical memory device of FIGS. 24 and 25. The methods may include processes substantially the same as or similar to that illustrated with reference to FIGS. 1 and 23, and thus detail explanations thereof may be omitted herein.

Figure 26:
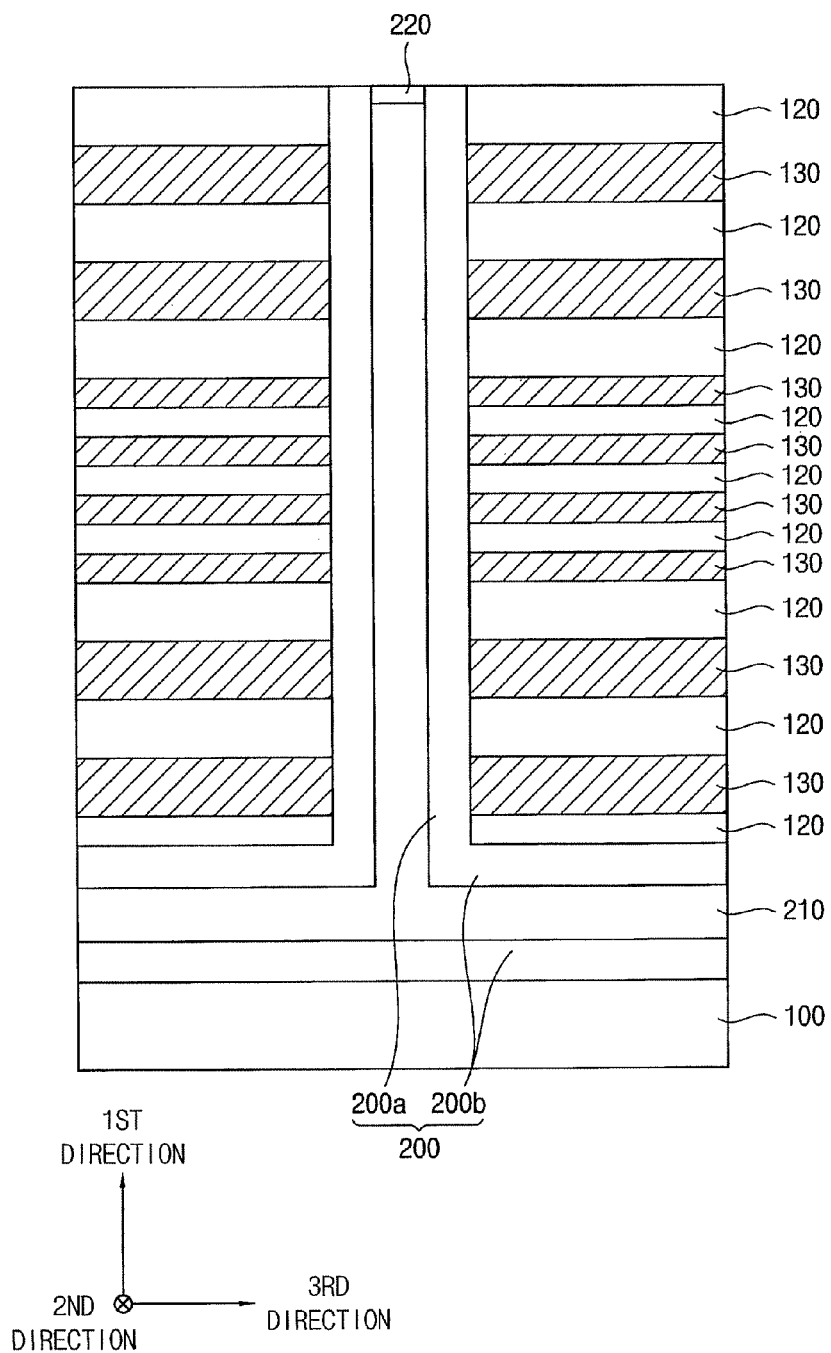
FIGS. 26-29 and FIGS. 30-33 are cross-sectional diagrams and plan diagrams, respectively, illustrating methods of manufacturing a vertical memory device of FIGS. 24 and 25 in accordance with example embodiments.
Figure 30:
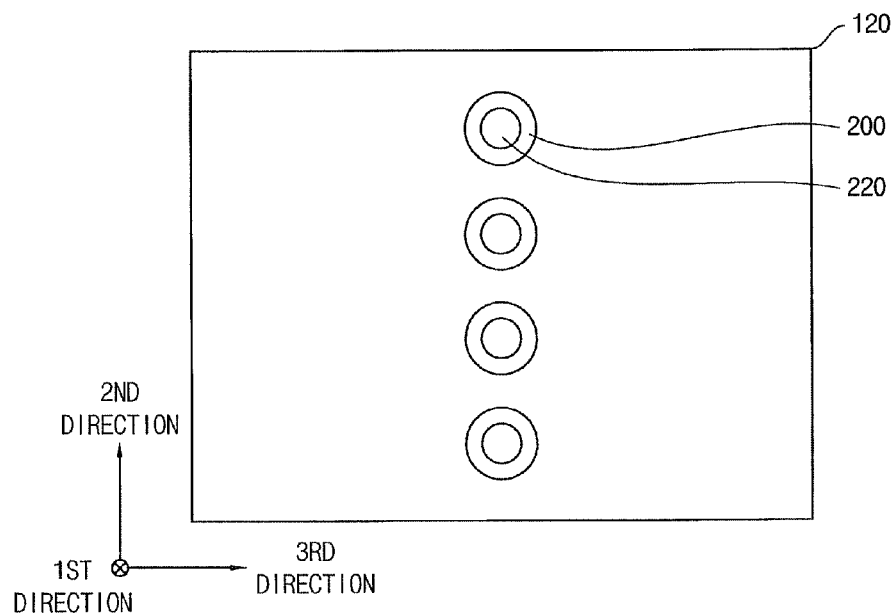

Referring to FIGS. 26 and 30, processes substantially the same as or similar to those illustrated with reference to FIGS. 3-6 and 14-17 may be performed to form a first insulation layer 120 and a second sacrificial layer 130 on a substrate 100, a first opening 140 through the first insulation layer 120 and the second sacrificial layer 130, and a first gap 160 on the substrate 100.

A first channel layer 200 may be formed on sidewalls inside the first opening 140 and the first gap 160, and a first filling layer 210 may be formed to fill remaining portions of the first opening 140 and the first gap 160. The first channel layer 200 may be formed to include a first vertical portion 200a of a hollow cylindrical shape in the first opening 140, and a first horizontal portion 200b including two plates spaced apart from each other on the wall inside the first gap 160. According to at least one example embodiment, the first channel layer 200 may include a pillar shaped first vertical portion 200a in the first opening 140, and a first horizontal portion 200b including a single plate in the first gap 160. In this case, the first filling layer 210 may not be formed.

An upper portion of the first filling layer 210 may be removed to, expose an upper portion of the first channel layer 200, and a pad 220 may be formed on the first filling layer 210 to cover the exposed upper portion of the first channel layer 200 and fill a remaining portion of the first opening 140. Edge portions of the first insulation layer 120 and the second sacrificial layer 130 may be removed (e.g., trimmed so that an area of the first insulation layer 120 and the second sacrificial layer 130 may become smaller from a bottom level to a top level).

Figure 27:
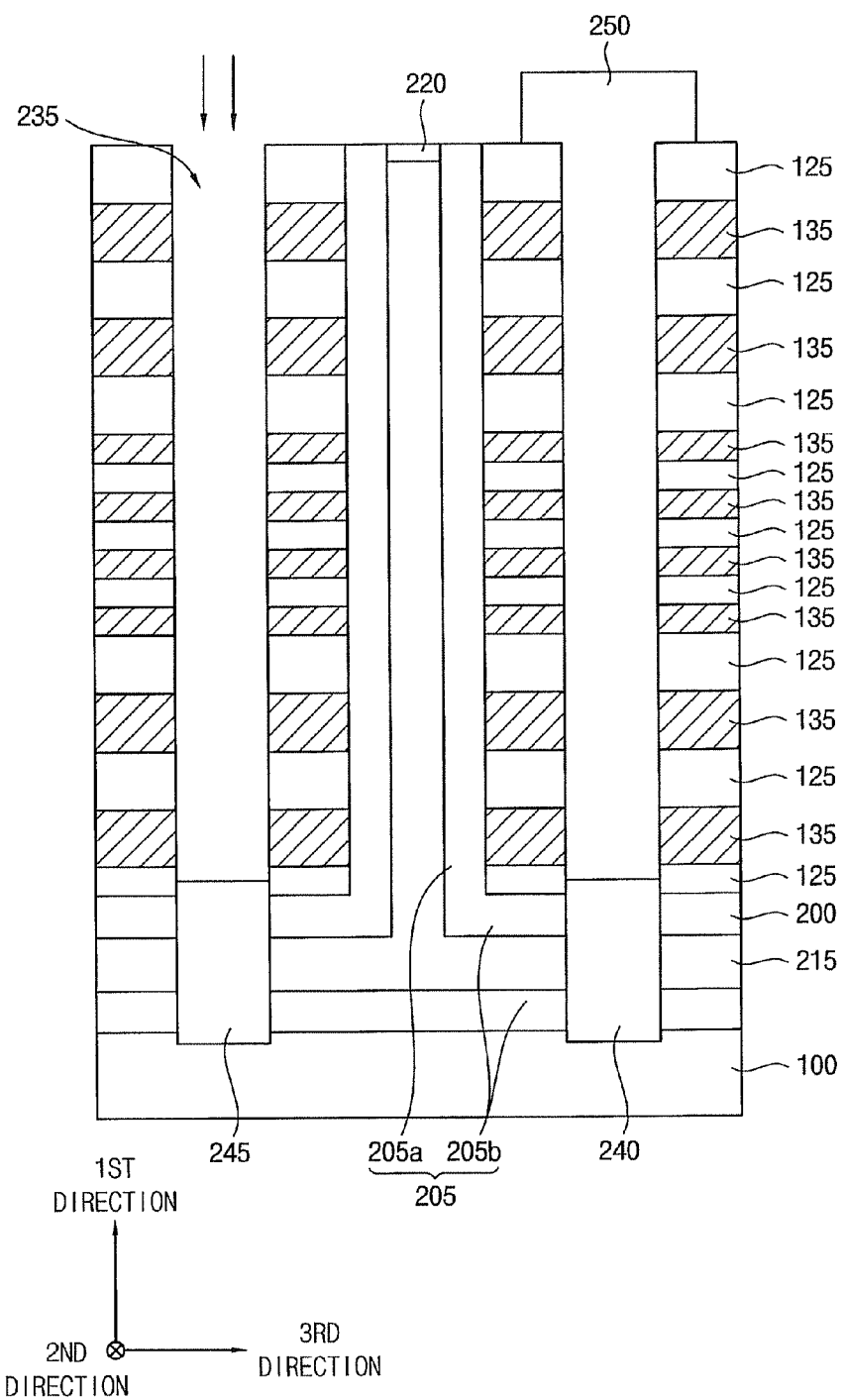
Figure 31:
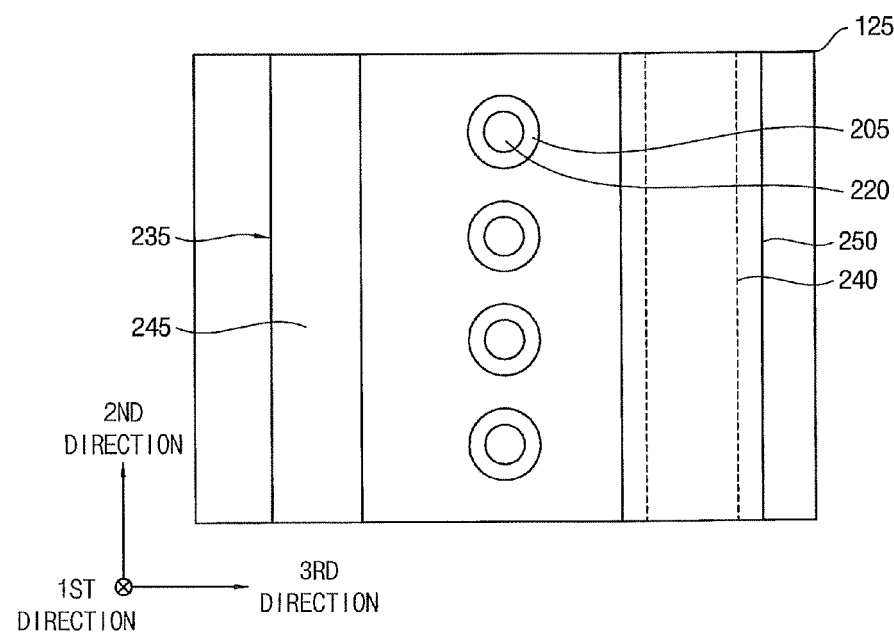

Referring to FIGS. 27 and 31, processes substantially the same as or similar to those illustrated with reference to FIGS. 8-10 and 19-21 may be performed. Second and third openings 230 and 235 may be formed through the first insulation layer 120, the second sacrificial layer 130, the first channel layer 200 and the first filling layer 210 to expose a top surface of the substrate 100. The first insulation layer 120, the second sacrificial layer 130, the first channel layer 200 and the first filling layer 210 may be transformed into a first insulation layer pattern 125, a second sacrificial layer pattern 135, a first channel 205 and a first filling layer pattern 215, respectively. The first channel 205 may include a first vertical portion 205a and a first horizontal portion 205b.

A contact layer 239 may be formed on the exposed top surface of the substrate 100 to partially fill the second and third openings 230 and 235, and an ion implantation mask 250 may be formed on a portion of the contact layer 239 to fill a remaining portion of the second opening 230. Impurities may be implanted into a portion of the contact layer 239 in the third opening 235 to form first and second contacts 240 and 245 in the second and third openings 230 and 235, respectively.

Figure 28:
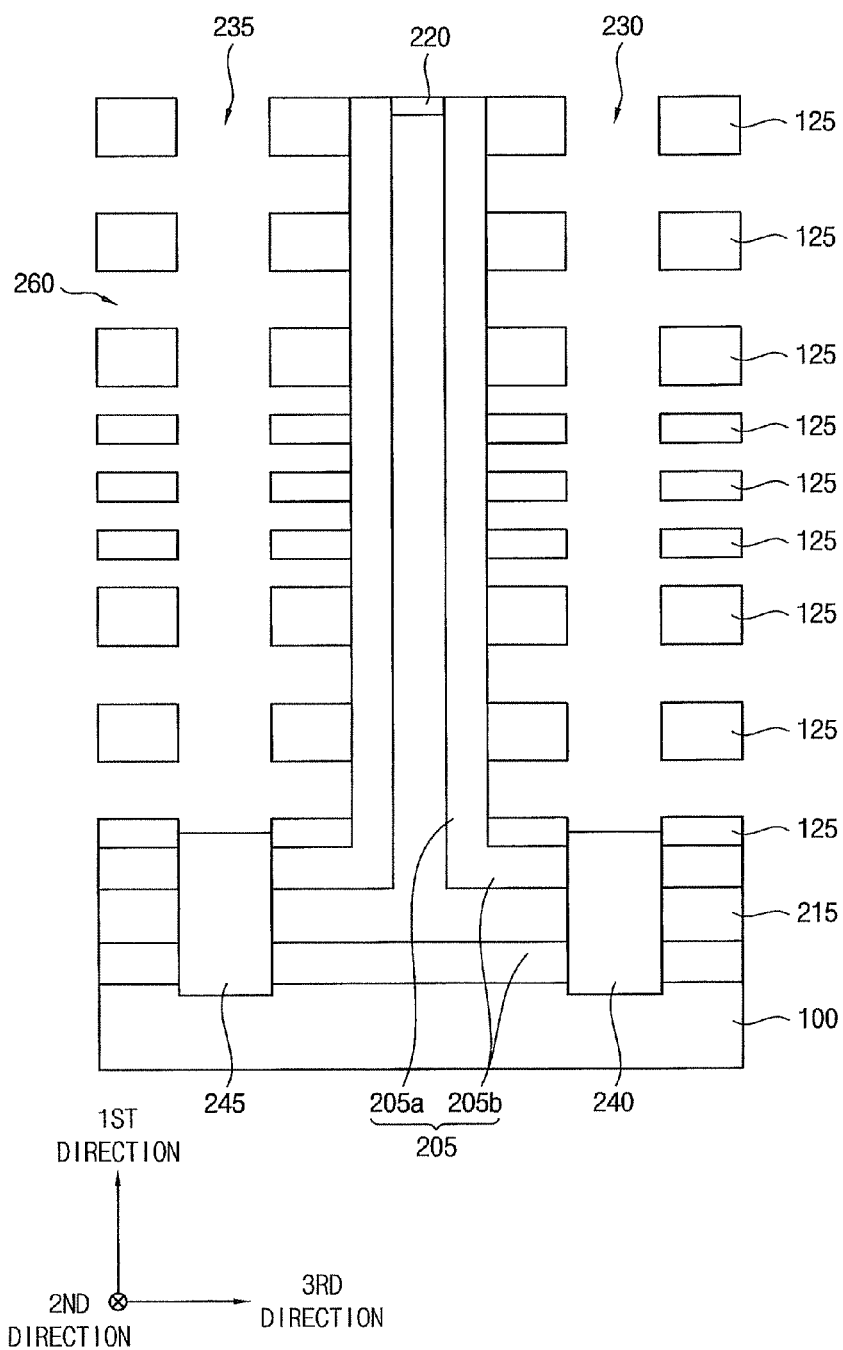
Figure 29:
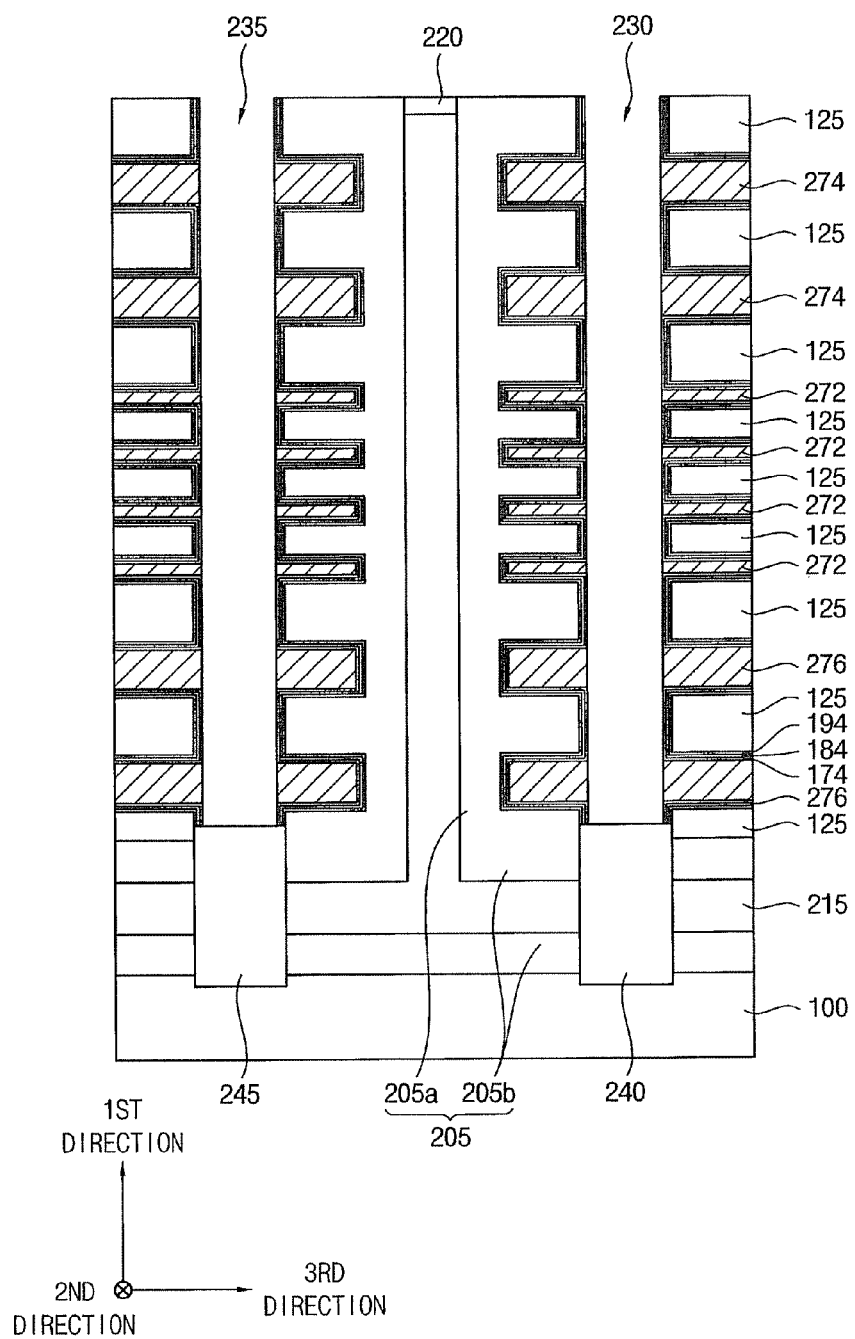
Figure 32:
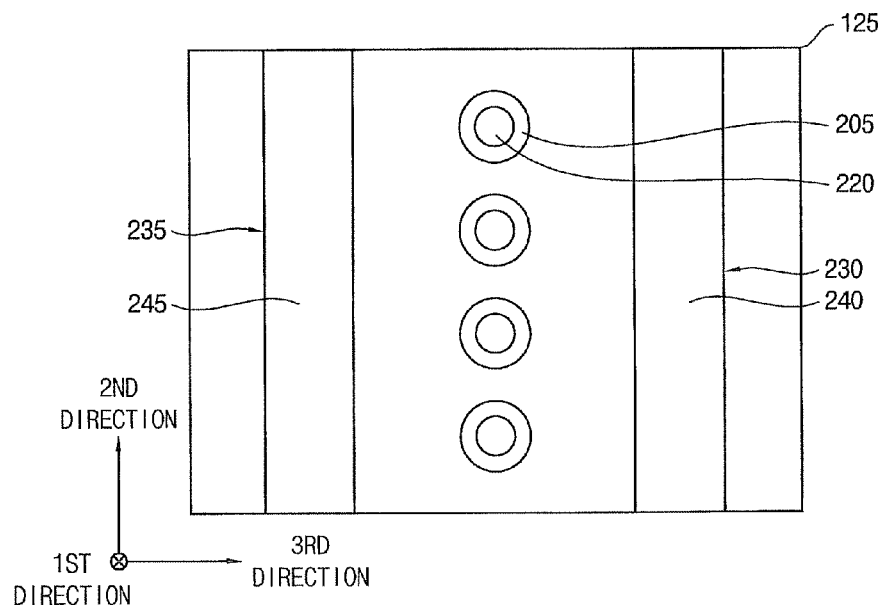
Figure 33:
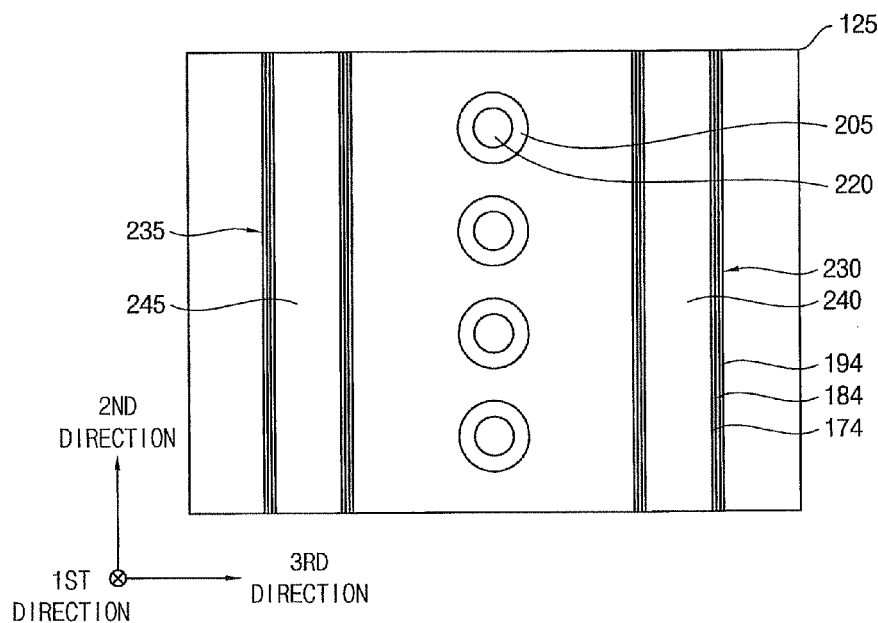

Referring to FIGS. 28 and 32, processes substantially the same as or similar to those illustrated with reference to FIGS. 11 and 22 may be performed. After removing the ion implantation mask 250, the second sacrificial layer patterns 135 exposed by the second and third openings 230 and 235 may be removed to form a second gap 260 between the first insulation layer patterns 125 at adjacent levels. A sidewall of the first channel 205 may be exposed by the second gap 260. Referring to FIGS. 29 and 33, a second tunnel insulation layer, a second charge trapping layer and a second blocking layer may be sequentially formed on an wall inside the second gap 260, a surface of the first insulation layer pattern 125, top surfaces of the first and second contacts 240 and 245, a top surface of the first channel 205 and a top surface of the pad 220.

A gate electrode layer may be formed on the second blocking layer to fill the second gap 260. The gate electrode layer may be partially removed to form a GSL 276, a word line 272 and an SSL 274 in the second gap 260. When the gate electrode layer is partially removed, portions of the second blocking layer, the second charge trapping layer and the second tunnel insulation layer on the top surface of the first insulation layer pattern 125, the top surfaces of the first and second contacts 240 and 245, the top surface of the first channel 205 and the top surface of the pad 220 may be also removed, thereby forming a second blocking layer pattern 174, a second charge trapping layer pattern 184 and a second tunnel insulation layer pattern 194, respectively. In example embodiments, portions of the second blocking layer, the second charge trapping layer and the second tunnel insulation layer on the sidewall of the first insulation layer pattern 125 may be also removed so that the second blocking layer pattern 174, the second charge trapping layer pattern 184 and the second tunnel insulation layer pattern 194 may be formed only on the wall inside the second gap 260.

Referring to FIGS. 24 and 25, processes substantially the same as or similar to those illustrated with reference to FIGS. 13, 1, 23 and 2 may be performed. A second insulation layer pattern 280 may be formed on inner walls of the second and third openings 230 and 235, and a bulk line 300 and a common source line (CSL) 290 filling remaining portions of the second and third openings 230 and 235, respectively, may be formed. A third insulation layer 310 may be formed on the first and second insulation layer patterns 125 and 280, the CSL 290, the bulk line 300, the first channel 205, the pad 220, the second blocking layer pattern 174, the second charge trapping layer pattern 184 and the second tunnel insulation layer pattern 194. A bit line contact 320 may be formed through the third insulation layer 310 on the pad 220, the CSL 290 and the bulk line 300. A bit line 330 electrically connected to the bit line contact 320 may be formed to complete the vertical memory device.

Figure 34:
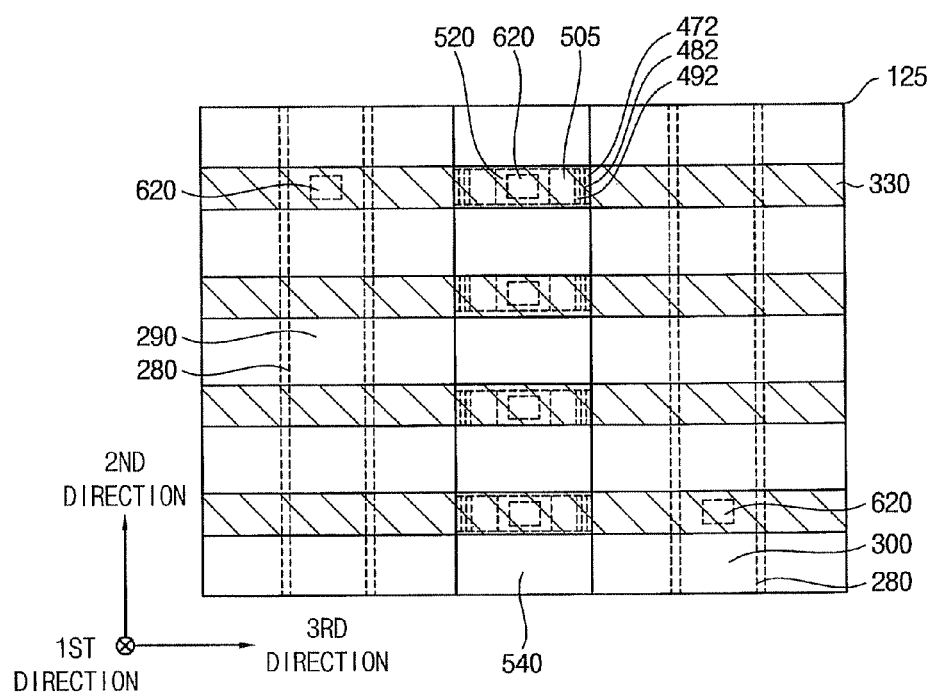
FIG. 34 is a plan diagram illustrating vertical memory devices in accordance with still other example embodiments.

FIG. 34 is a plan diagram illustrating vertical memory devices in accordance with still other example embodiments. The vertical memory device of FIG. 34 may be substantially the same as that of FIGS. 1 and 2, except that the vertical memory device may further include an insulation layer pattern and the shapes of a channel, a tunnel insulation layer pattern, a charge trapping layer pattern and a blocking layer pattern may be different from those of FIGS. 1 and 2. Repetitive explanations thereof may be omitted herein. The vertical memory devices of FIGS. 1 and 2 may include a cylindrical channel, and the vertical memory devices of FIG. 34 may include a linear channel.

Referring to FIG. 34, the vertical memory device may include a second channel 505, a GSL (not shown), a word line (not shown), an SSL (not shown), first and second contacts (not shown), a CSL 290 and a bulk line 300. The vertical memory device may further include a bit line 330. The second channel 505 may include a second vertical portion 505a extending in a first direction substantially perpendicular to a top surface of a substrate (not shown), and a second horizontal portion (not shown) connected to the second vertical portion 505a and parallel to the top surface.

According to example embodiments, the second vertical portion 505a of the second channel 505 may be of a linear or bar shape extending in the first direction on both sidewalls of each first filling layer pattern (not shown) and each pad 520. According to example embodiments, a plurality of second vertical portions 505a may be in a second direction substantially parallel to the top surface of the substrate to define a second vertical portion column, and a plurality of second vertical portion columns may be in a third direction substantially perpendicular to the second direction to define a second vertical portion array. The second horizontal portion may be connected to the second vertical portion column or to the second vertical portion array.

According to example embodiments, the second horizontal portion of the second channel 505 may include two parallel plates spaced apart from each other, and the first filling layer pattern may be between the two parallel plates. The pad 520 on the first filling layer pattern may electrically connect a bit line contact 620 contained in a fourth insulation layer (not shown) to the second channel 505. A third tunnel insulation layer pattern 492, a third charge trapping layer pattern 482 and a third blocking layer pattern 472 may be between each of the GSL, the word line and the SSL, and a sidewall of the second vertical portion 505a of the second channel 505, on which the first filling layer pattern and the pad 520 are not formed, sequentially in a direction substantially perpendicular to the sidewall of the second vertical portion 505a (e.g., in the third direction).

The third tunnel insulation layer pattern 492, the third charge trapping layer pattern 482 and the third blocking layer pattern 472 may be further formed between a sidewall of the second horizontal portion of the second channel 505 and a first insulation layer pattern (not shown) and/or the substrate. The first and second contacts may protrude from a top surface of the substrate, and be connected to the bulk line 300 and the CSL 290 through the third tunnel insulation layer pattern 492, the third charge trapping layer pattern 482, the third blocking layer pattern 472, the second horizontal portion of the second channel 505 and the first filling layer pattern.

Figure 35:
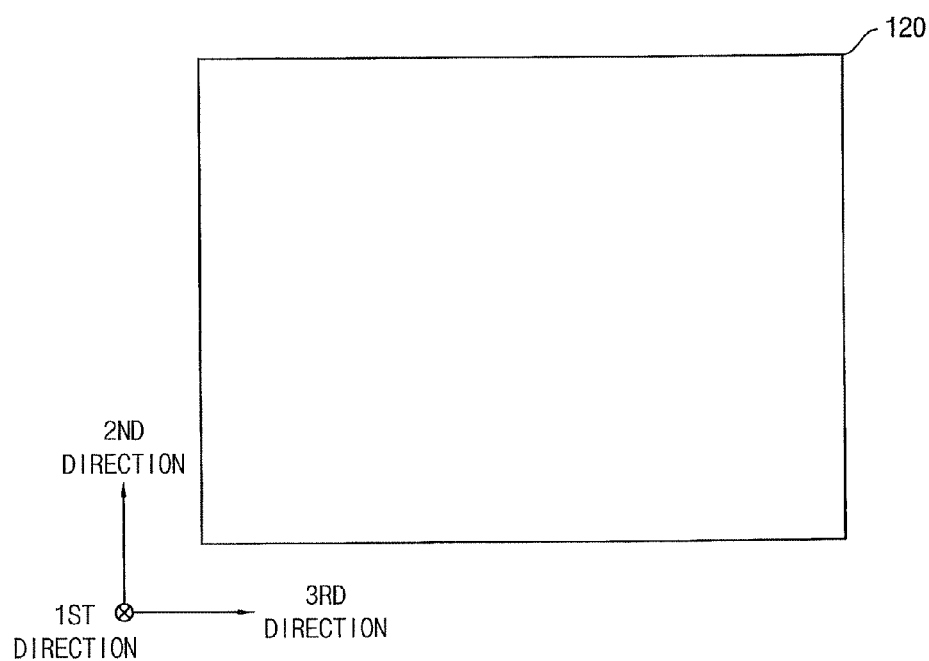

FIGS. 35-46 are plan diagrams illustrating methods of manufacturing a vertical memory device of FIG. 34 in accordance with example embodiments. The method may include processes substantially the same as or similar to those of FIGS. 1-23, and detailed explanations thereof may be omitted herein. Referring to FIG. 35, processes substantially the same as or similar to those illustrated with reference to FIGS. 3 and 14 may be performed. A first sacrificial layer 110 (refer to FIG. 36) may be formed on a substrate 100 (refer to FIG. 35), and a first insulation layer 120 and a sacrificial layer (not shown) may be alternately and repeatedly formed on the first sacrificial layer 110.

Figure 36:
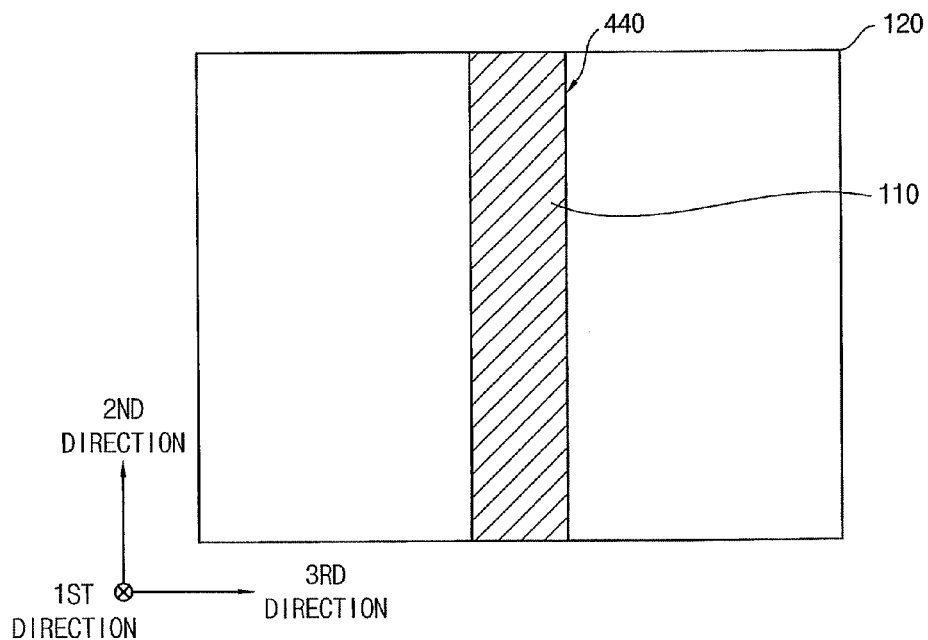

Referring to FIG. 36, processes substantially the same as or similar to those illustrated with reference to FIGS. 4 and 15 may be performed. A first opening 440 may be formed through the first insulation layer 120 and the second sacrificial layer to expose the first sacrificial layer 110. The first opening 440 may be formed to extend in a first direction substantially perpendicular to a top surface of the substrate 100. The first opening 440 may not be island shaped but may extend in a second direction substantially parallel to the top surface of the substrate 100. According to example embodiments, a plurality of first opening 440 may be formed in a third direction substantially perpendicular to the second direction.

Figure 37:
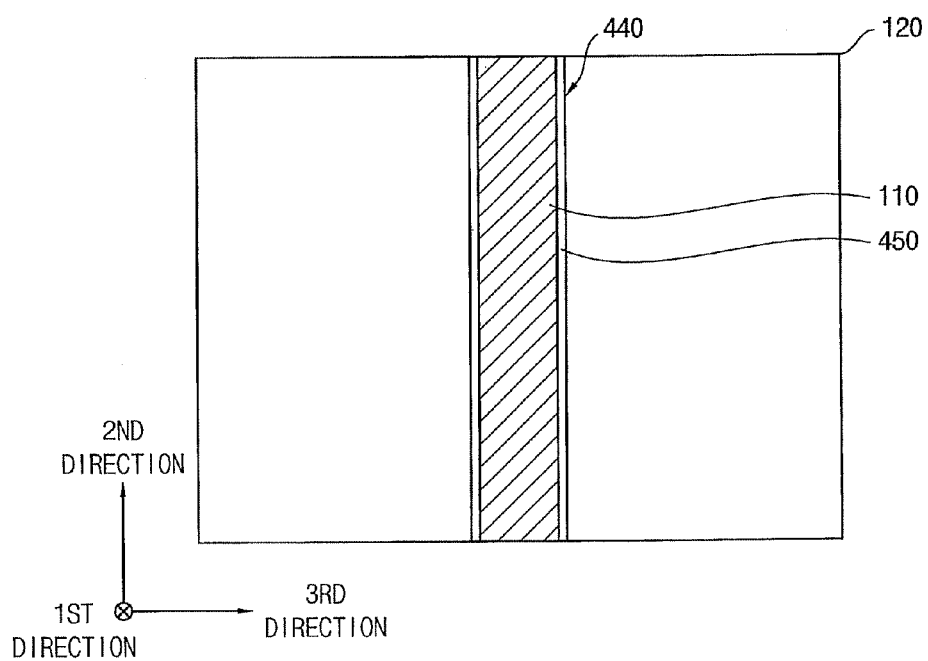
Figure 38:
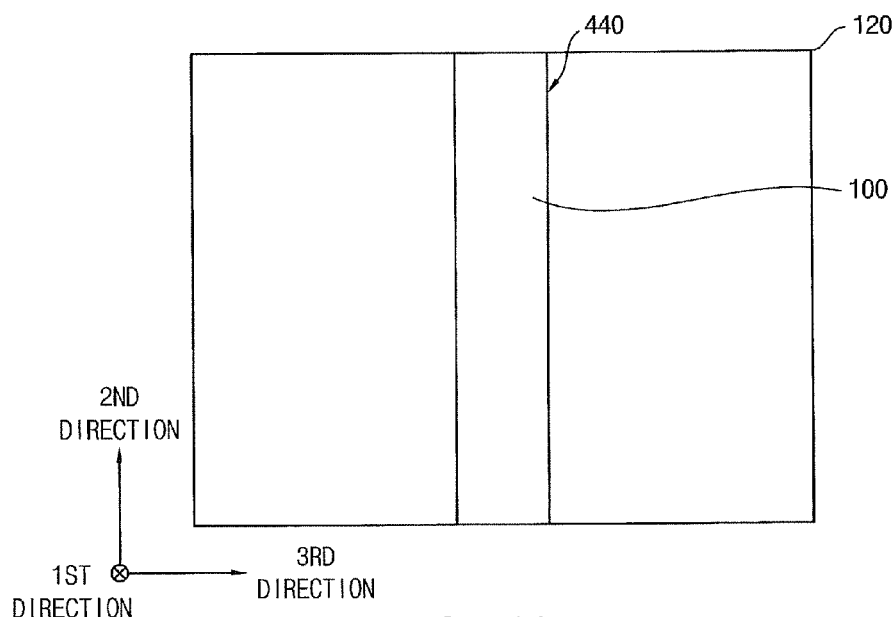

Referring to FIG. 37, processes substantially the same as or similar to those illustrated with reference to FIGS. 5 and 16 may be performed to form an etch stop layer 450 on both sidewalls of the first opening 440. Referring to FIG. 38, processes substantially the same as or similar to those illustrated with reference to FIGS. 6 and 17 may be performed to remove the first sacrificial layer 110 so that a first gap (not shown) may be formed. The etch stop layer 450 may be removed.

Figure 39:
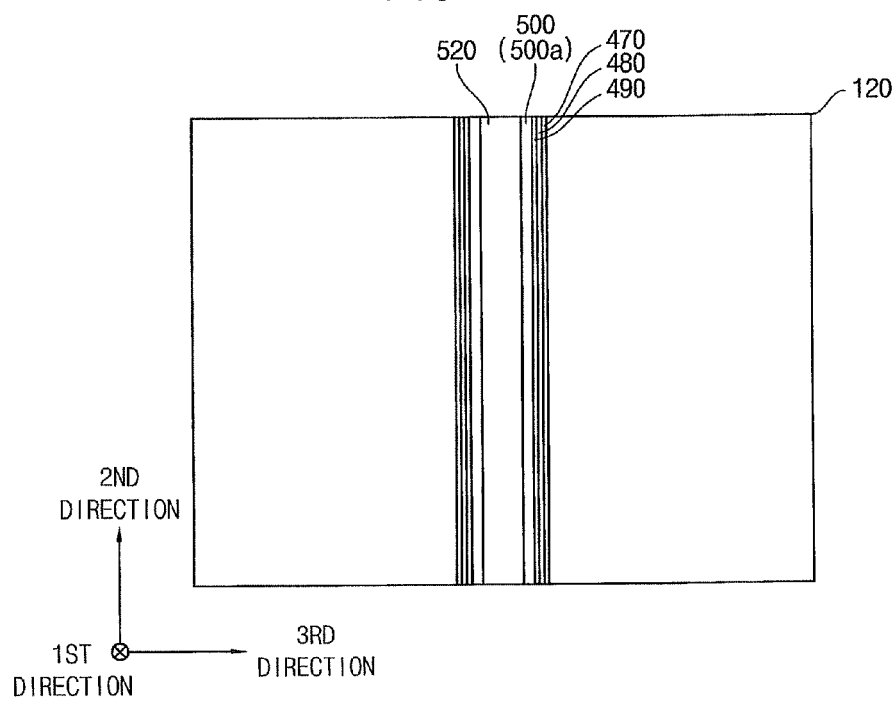

Referring to FIG. 39, processes substantially the same as or similar to those illustrated with reference to FIGS. 7 and 18 may be performed. A third blocking layer 470, a third charge trapping layer 480 and a third tunnel insulation layer 490 may be sequentially formed on both sidewalls inside the first opening 440 and a wall inside the first gap. A first filling layer (not shown) and a pad 520 may be formed to fill a remaining portion of the first opening 440 and the first gap. A second channel layer 500 including a second vertical portion 500a on both sidewalls inside the first opening 440 and a second horizontal portion (not shown) with two parallel plates spaced apart from each other in the first gap may be formed.

According to example embodiments, a plurality of second vertical portions may be formed in correspondence to the plurality of first openings 440. Edge portions of the first insulation layer 120 and the second sacrificial layer may be removed (e.g., trimmed so that an area of the first insulation layer 120 and the second sacrificial layer may become smaller from a bottom level to a top level).

Referring to FIG. 40, processes substantially the same as or similar to those illustrated with reference to FIGS. 8 and 19 may be performed. Second and third openings 230 and 235 may be funned through the first insulation layer 120, the second sacrificial layer, the third blocking layer 470, the third charge trapping layer 480, the third tunnel insulation layer 490, the second channel layer 500 and the first filling layer to expose a top surface of the substrate 100. According to example embodiments, when the second and third openings 230 and 235 are formed, an upper portion of the substrate 100 may be also removed.

According to example embodiments, each of the second and third openings 230 and 235 may extend in the second direction, and a plurality of second openings 230 and a plurality of third openings 235 may be formed in the third direction. According to example embodiments, one second opening 230 and one third opening 235 may be formed before and after the second vertical portion 500a of the second channel layer 500, respectively, in the third direction.

The first insulation layer 120, the second sacrificial layer, the third blocking layer 470, the third charge trapping layer 480, the third tunnel insulation layer 490, the second channel layer 500 and the first filling layer may be transformed into a first insulation layer pattern 125, a second sacrificial layer pattern (not shown), a third blocking layer pattern 472, a third charge trapping layer pattern 482, a third tunnel insulation layer pattern 492, a second channel 505 and a first filling layer pattern (not shown), respectively. The second channel 505 may include a second vertical portion 505a and a second horizontal portion (not shown).

Referring to FIG. 41, processes substantially the same as or similar to those illustrated with reference to FIGS. 9 and 20 may be performed to form a contact layer 239 filling the second and third openings 230 and 235 on the exposed top surface of the substrate 100. The contact layer 239 may be formed to extend in the second direction. According to example embodiments, the contact layer 239 may be doped with impurities (e.g., p-type impurities).

Referring to FIG. 42, processes substantially the same as or similar to those illustrated with reference to FIGS. 10 and 21 may be performed. An ion implantation mask 250 may be formed on a first portion of the contact layer 239 to fill a remaining portion of the second opening 230, and impurities may be implanted into a second portion of the contact layer 239 in the third opening 235. According to example embodiments, n-type impurities may be doped into the second portion of the contact layer 239, for example. First and second contacts 240 and 245 may be formed in the second and third openings 230 and 235, respectively. Each of the first and second contacts 240 and 245 may extend in the second direction.

Referring to FIG. 43, processes substantially the same as or similar to those illustrated with reference to FIGS. 11 and 22 may be performed. After removing the ion implantation mask 250, the second sacrificial layer patterns exposed by the second and third openings 230 and 235 may be removed to form a second gap (not shown) between the first insulation layer patterns 125 at adjacent levels. A sidewall of the third blocking layer pattern 472 may be exposed by the second gap.

Figure 44:
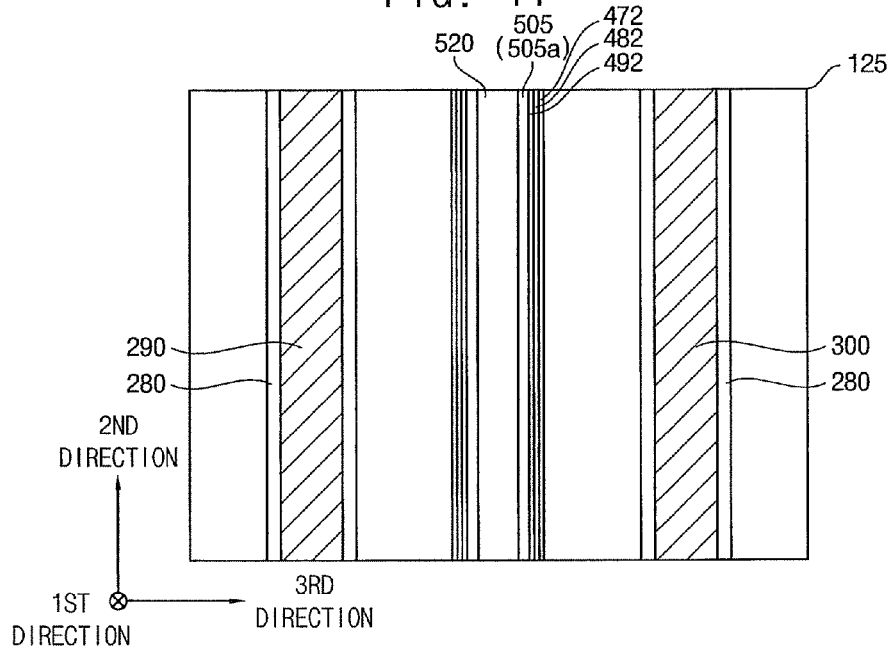

Referring to FIG. 44, processes substantially the same as or similar to those illustrated with reference to FIGS. 12, 13 and 23 may be performed. A GSL (not shown), a word line (not shown) and an SSL (not shown) filling the second gap and extending in the second direction may be formed. A second insulation layer pattern 280 may be formed on walls inside the second and third openings 230 and 235, and a bulk line 300 and a CSL 290 filling remaining portions of the second and third openings 230 and 235, respectively, may be formed. Each of the bulk line 300 and the CSL 290 may be formed to extend in the second direction. According to example embodiments, one bulk line 300 and one CSL 290 may be formed before and after the second channel 505, respectively, in the third direction.

Figure 45:
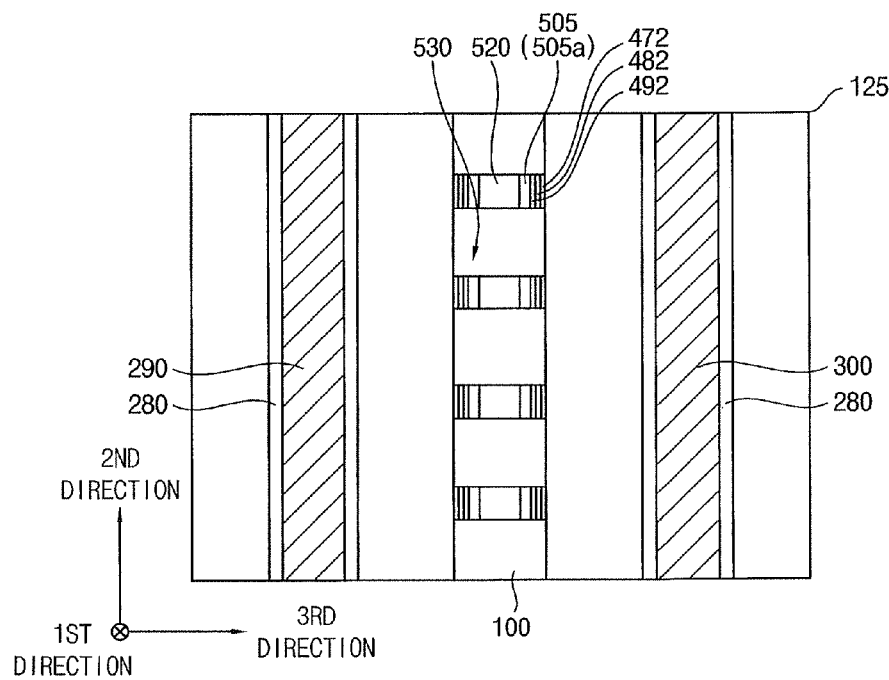

Referring to FIG. 45, the second channel 505, the pad 520, the third blocking layer pattern 472, the third charge trapping layer pattern 482, the third tunnel insulation layer pattern 492 and the first filling layer pattern may be partially removed to form a fourth opening 530 exposing a top surface of the substrate 100 and extending in the first direction. According to example embodiments, a plurality of island shaped fourth openings 530 may be formed in the first direction to define a fourth opening column.

Figure 46:
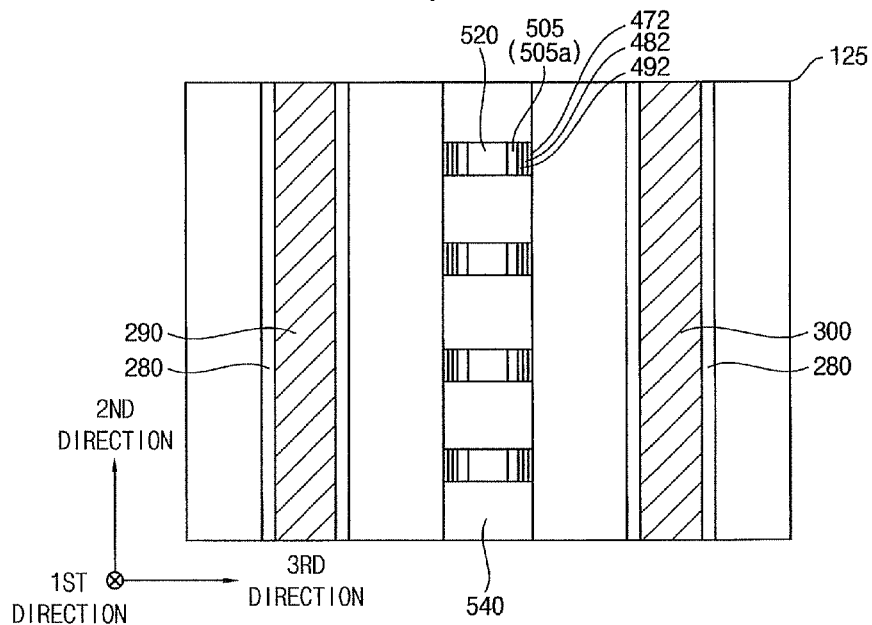

Referring to FIG. 46, a third insulation layer pattern 540 may be formed in the fourth opening 530. A third insulation layer (not shown) filling the fourth opening 530 may be formed on the substrate 100, the first and second insulation layer patterns 125 and 280, the pad 520, the CSL 290, the bulk line 300, the second channel 505, the third blocking layer pattern 472, the third charge trapping layer pattern 482 and the third tunnel insulation layer pattern 492, and the third insulation layer may be planarized until a top surface of the first insulation layer pattern 125 is exposed to form the third insulation layer pattern 540. According to example embodiments, a plurality of island shaped third insulation layer patterns 540 may be formed in the second direction. According to example embodiments, the third insulation layer may be formed using, for example, an insulating material (e.g., an oxide).

Referring to FIG. 34, processes substantially the same as or similar to those illustrated with reference to FIGS. 1 and 2 may be performed. A fourth insulation layer may be formed on the first to third insulation layer patterns 125, 280 and 540, the CSL 290, the bulk line 300, the second channel 505, the pad 520, the third blocking layer pattern 472, the third charge trapping layer pattern 482 and the third tunnel insulation layer pattern 492, and a fifth opening (not shown) exposing a top surface of the pad 520 and sixth openings (not shown) exposing top surfaces of the CSL 290 and the bulk line 300 may be formed. According to example embodiments, a plurality of fifth openings may be formed in the second direction to define a fifth opening column. One or a plurality of sixth openings exposing each of the CSL 290 and the bulk line 300 may be formed. A bit line contact 620 may be formed on the pad 520, the CSL 290 and the bulk line 300 to fill the fifth and sixth openings. A bit line 330 electrically connected to the bit line contact 520 may be formed to complete the vertical memory device.

Figure 47:
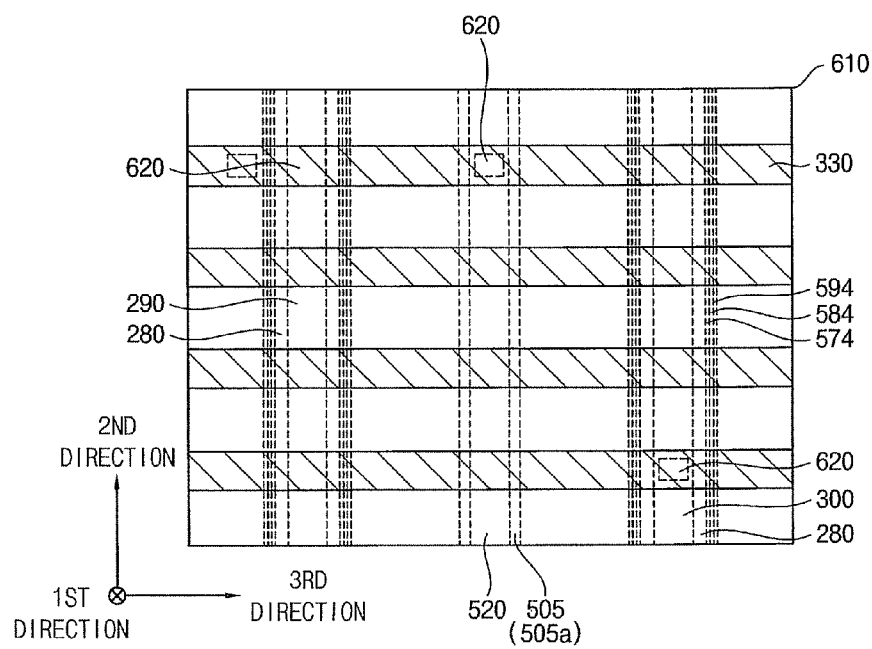
FIG. 47 is a cross-sectional diagram illustrating vertical memory devices in accordance with yet other example embodiments.

FIG. 47 is a plan diagram illustrating vertical memory devices in accordance with yet other example embodiments. The vertical memory device of FIG. 47 may be substantially the same as or similar to that of FIG. 34 except for the positions and shapes of a tunnel insulation layer pattern, a charge trapping layer pattern and a blocking layer pattern, and thus repetitive explanations thereof may be omitted. Referring to FIG. 47, the vertical memory device may include a second channel 505, a GSL (not shown), a word line (not shown), an SSL (not shown), first and second contacts (not shown), a CSL 290 and a bulk line 300 on a substrate (not shown). The vertical memory device may further include a bit line 330.

The GSL, the word line and the SSL may be formed on a sidewall of a second vertical portion 505a of the second channel 505 sequentially in a first direction substantially perpendicular to a top surface of the substrate, and spaced apart from each other. Each of the GSL, the word line and the SSL may be formed at one level or more than one level, and a first insulation layer pattern (not shown) may be interposed therebetween. According to example embodiments, each of the GSL, the word line and the SSL may extend in a second direction substantially parallel to a top surface of the substrate, and a plurality of GSLs, a plurality of word lines, and a plurality of SSLs may be formed in a third direction substantially perpendicular to the second direction.

A fourth tunnel insulation layer pattern 594, a fourth charge trapping layer pattern 584 and a fourth blocking layer pattern 574 may be formed between the sidewall of the second vertical portion 505a of the second channel 505 and each of the GSL, the word line and the SSL sequentially in a direction substantially perpendicular to the sidewall of the second vertical portion 505a (e.g., in the third direction). The fourth tunnel insulation layer pattern 594, the fourth charge trapping layer pattern 584 and the fourth blocking layer pattern 574 may be also formed between the first insulation layer pattern and each of the GSL, the word line and the SSL, and formed between the first insulation layer pattern and a second insulation layer pattern 280.

Figure 48:
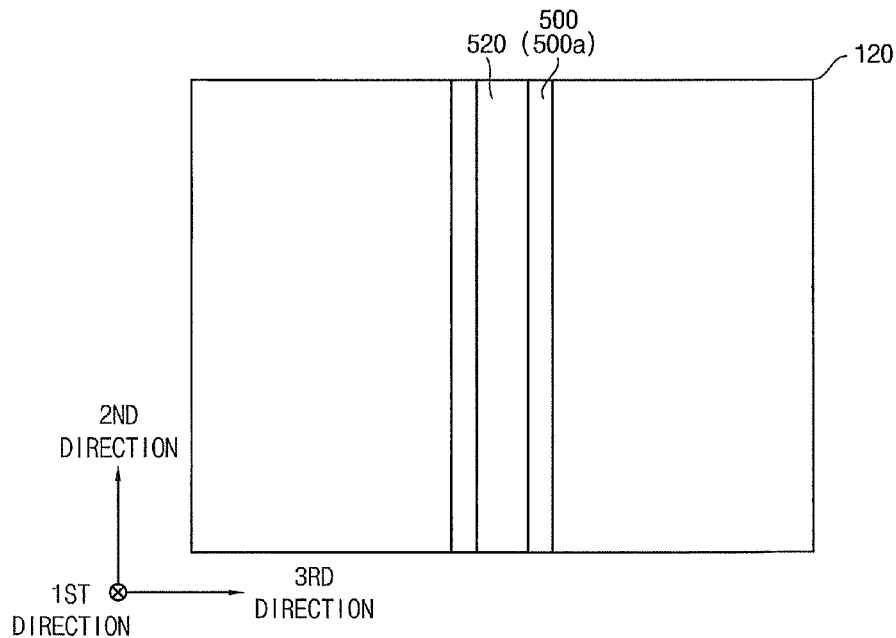
FIGS. 48-50 are plan diagrams illustrating methods of manufacturing a vertical memory device of FIG. 47 in accordance with example embodiments.
Figure 49:
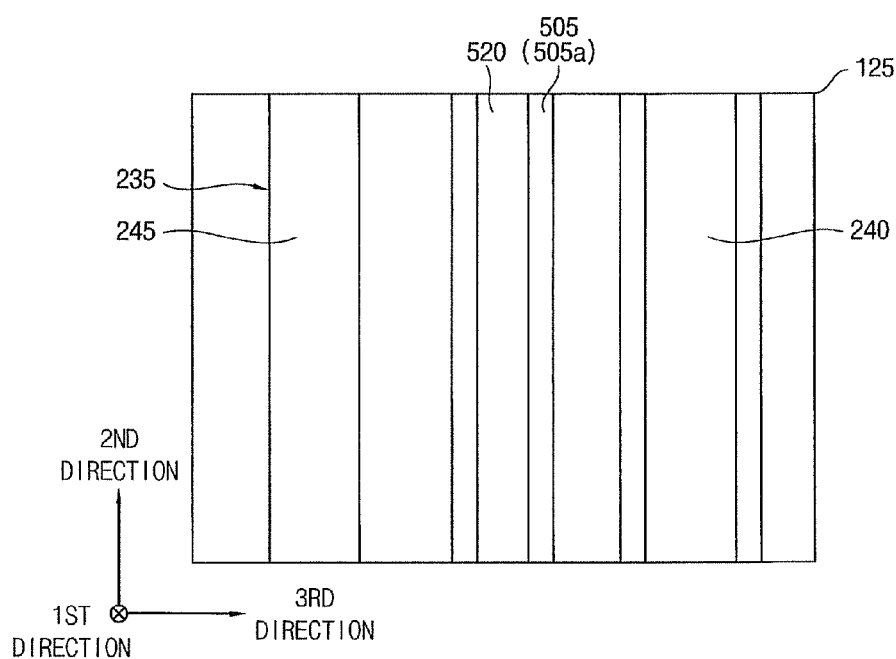
Figure 50:
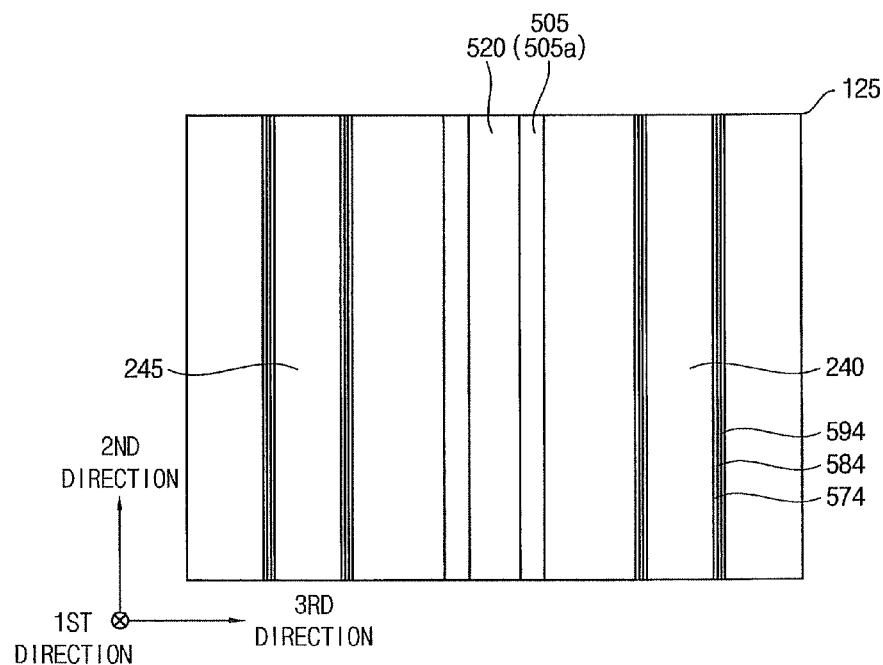

FIGS. 48-50 are plan diagrams illustrating methods of manufacturing a vertical memory device of FIG. 47 in accordance with example embodiments. The methods may include processes substantially the same as or similar to that illustrated with reference to FIGS. 25-33, and thus detail explanations thereof may omitted herein. Referring to FIG. 48, processes substantially the same as or similar to those illustrated with reference to FIGS. 35-38 may be performed.

A first sacrificial layer (not shown) may be formed on a substrate (not shown), and a first insulation layer 120 and a second sacrificial layer (not shown) may be formed alternately and repeatedly on the first sacrificial layer. A first opening (not shown) may be formed through the first insulation layer 120 and the second sacrificial layer 130 to form a first opening (not shown) exposing the first sacrificial layer and extending in a first direction substantially perpendicular to a top surface of the substrate. The first opening may be formed to extend in a second direction substantially parallel to the top surface of the substrate.

According to example embodiments, a plurality of first openings may be formed in a third direction substantially perpendicular to the second direction. The first sacrificial layer may be removed to form a first gap (not shown). A second channel layer 500 may be formed on inner walls of the first opening and the first gap, and a first filling layer (not shown) may be formed to fill remaining portions of the first opening and the first gap.

Referring to FIG. 49, processes substantially the same as or similar to those illustrated with reference to FIGS. 39-43 may be performed. However, a blocking layer pattern, a charge trapping layer pattern and a tunnel insulation layer pattern may not be formed. Second and third openings 230 and 235 may be formed through the first insulation layer 120, the second sacrificial layer, the second channel layer 500 and the first filling layer to expose a top surface of the substrate. The first insulation layer 120, the second sacrificial layer, the second channel layer 500 and the first filling layer may be transformed into a first insulation layer pattern 125, a second sacrificial layer pattern (not shown), a second channel 505 and a first filling layer pattern (not shown), respectively. The second channel 505 may include a second vertical portion 505a and a second horizontal portion 505b. First and second contacts 240 and 245 partially filling the second and third openings 230 and 235, respectively, may be formed on the exposed top surface of the substrate.

Referring to FIG. 50, the second sacrificial layer patterns exposed by the second and third openings 230 and 235 may be removed to form a second gap (not shown) between the first insulation layer patterns 125 at adjacent levels. A sidewall of the second channel 505 may be exposed by the second gap. A fourth tunnel insulation layer pattern 594, a fourth charge trapping layer pattern 584 and a fourth blocking layer pattern 574 may be sequentially formed on an inner wall of the second gap and a surface of the first insulation layer pattern 125, and a GSL (not shown), a word line (not shown) and an SSL (not shown) filling the second gap may be formed on the fourth blocking layer pattern 474.

Referring to FIG. 47, processes substantially the same as or similar to those illustrated with reference to FIGS. 44-46 and 34 may be performed. A second insulation layer pattern 280 may be formed on inner walls of the second and third openings 230 and 235, and a bulk line 300 and a CSL 290 filling remaining portions of the second and third openings 230 and 235, respectively, may be formed. A fourth insulation layer 610 may be formed on the first and second insulation layer patterns 125 and 280, the CSL 290, the bulk line 300, the second channel 505, the pad 520, the fourth blocking layer pattern 474, the fourth charge trapping layer pattern 484 and the fourth tunnel insulation layer pattern 494. A bit line contact 620 may be formed through the fourth insulation layer 610 on the pad 520, the CSL 290 and the bulk line 300. A bit line 330 electrically connected to the bit line contact 620 may be formed to complete the vertical memory device.

Figure 51:
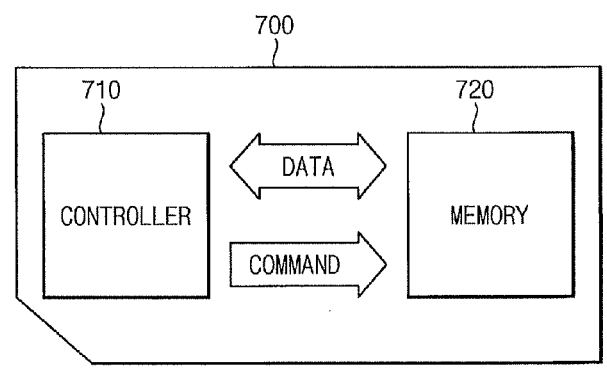
FIG. 51 is a schematic diagram illustrating memory cards according to example embodiments.

FIG. 51 is a schematic diagram illustrating a memory card 700 according to example embodiments. Referring to FIG.

51, a controller 710 and a memory 720 may exchange electric signals. For example, according to commands of the controller 710, the memory 720 and the controller 710 may exchange data. The memory card 700 may store data in the memory 720 and/or output data from the memory 720. The memory 720 may include one of the vertical memory devices described above in reference to FIGS. 1-50. A memory card 700 may be used as, for example, a storage medium for various portable electronic devices. For example, the memory card 700 may be a multimedia card (MMC) and/or a secure digital (SD) card.

Figure 52:
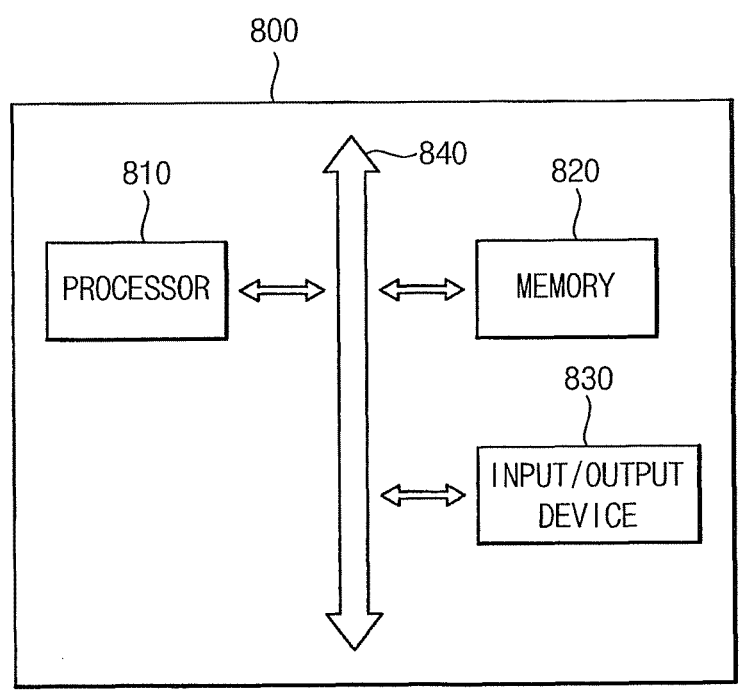

FIG. 52 is a block diagram illustrating an electronic system 800 according to example embodiments. Referring to FIG. 52, a processor 810, an input/output device 830, and a memory 820 may perform data communication with each other by using a bus 840. The processor 810 may execute a program and control the electronic system 800. The input/output device 830 may be used to input/output data to/from the electronic system 800. The electronic system 800 may be connected to an external device (e.g. a personal computer and/or a network) by using the input/output device 830 and may exchange data with the external device.

The memory 820 may store code and/or programs for operations of the processor 810. The memory 820 may include at least one of the vertical memory devices described above in reference to FIGS. 1-51. For example, an electronic system 800 may embody various electronic control systems requiring the memory 820, and, for example, may be used in mobile phones, MP3 players, navigation devices, solid state disks (SSD), and/or household appliances.

While example embodiments have been particularly shown and described, it will be understood by one of ordinary skill in the art that variations in form and detail may be made therein without departing from the spirit and scope of the claims.

What is claimed is:

1. A vertical memory device, comprising:
  a channel including a vertical portion and a horizontal portion, the vertical portion extending in a first direction substantially perpendicular to a top surface of a substrate, the horizontal portion connected to the vertical portion and parallel to the top surface of the substrate;
  a ground selection line (GSL), word lines and a string selection line (SSL) on a sidewall of the vertical portion of the channel in the first direction, the GSL, the word lines and the SSL being spaced apart from each other;
  a contact on the substrate, the contact electrically connected to the horizontal portion of the channel; and
  a tunnel insulation layer pattern, a charge trapping layer pattern and a blocking layer pattern on and surrounding the channel.

2. The device of claim 1, wherein:
  the vertical portion is a plurality of vertical portions spaced apart in a second direction substantially parallel to the top surface of the substrate; the vertical portions defining a vertical portion column, each of the vertical portions being island shaped; and
  the horizontal portion of the channel is on the substrate and connected to the vertical portion column.

3. The device of claim 2, wherein two contacts are on opposite sides of the vertical portion column from each other in a third direction substantially perpendicular to the second direction, each of the two contacts extending in the second direction.

4. The device of claim 3, further comprising:
  a common source line (CSL) and a bulk line each electrically connected to a different one of the two contacts, the CSL and the bulk line extending in the second direction.

5. The device of claim 2, further comprising:
  a bit line electrically connected to at least one of the vertical portions, the bit line extending in a third direction substantially perpendicular to the second direction.

6. The device of claim 1, wherein a shape of the channel is a hollow cylindrical shape.

7. The device of claim 6, further comprising:
  a filling layer pattern filling a space defined by the hollow cylindrically shaped channel.

8. The device of claim 1, wherein the contact includes single crystal silicon.

9. The device of claim 1, wherein a shape of the vertical portion of the channel is a linear shape extending in the first direction.

10. An electronic system, comprising:
  a processor;
  an input/output device;
  a memory including the vertical memory device of claim 1; and
  a bus connecting the processor, the input/output device and the memory.

11. A method of manufacturing a vertical memory device, comprising;
  forming a channel including a vertical portion and a horizontal portion, the vertical portion extending in a first direction substantially perpendicular to a top surface of a substrate, the horizontal portion being connected to the vertical portion and parallel to the top surface of the substrate;
  forming a contact electrically connected to the horizontal portion of the channel; and
  forming a ground selection line (GSL), word lines and a string selection line (SSL) on a sidewall of the vertical portion of the channel in the first direction, the GSL, the word lines and the SSL being spaced apart from each other;
  forming a first sacrificial layer on the substrate;
  forming a plurality of insulation layers and second sacrificial layers on the first sacrificial layer by alternating between forming one of the insulation layers and forming one of the second sacrificial layers:
  forming a first opening through the insulation layers and the second sacrificial layers to expose the first sacrificial layer;
  removing the first sacrificial layer to form a gap exposing the substrate; and
  forming the vertical portion and the horizontal portion in the first opening and the gap, respectively.

12. The method of claim 11, wherein the forming a channel includes:
  forming a plurality of vertical portions in a second direction substantially parallel to a top surface of the substrate; and
  forming each of the horizontal portion and at least one of the vertical portions in a hollow cylindrical shape.

13. The method of claim 12, further comprising:
  filling spaces defined by the hollow cylindrically shaped vertical and horizontal portions with a filling layer.

14. The method of claim 11, wherein the forming a channel includes forming a plurality of vertical portions in a second direction substantially parallel to the top surface of the substrate, a shape of each of the vertical portions being a linear shape extending in the first direction.

* * * * *